(12) United States Patent
Akaike

(10) Patent No.: US 11,031,254 B2
(45) Date of Patent: Jun. 8, 2021

(54) METHOD FOR MANUFACTURING A SEMICONDUCTOR DEVICE

(71) Applicant: RENESAS ELECTRONICS CORPORATION, Tokyo (JP)

(72) Inventor: Yasuhiko Akaike, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 90 days.

(21) Appl. No.: 16/585,739

(22) Filed: Sep. 27, 2019

(65) Prior Publication Data

US 2020/0144075 A1 May 7, 2020

(30) Foreign Application Priority Data

Nov. 7, 2018 (JP) .............................. JP2018-209988

(51) Int. Cl.
| | |
|---|---|
| *H01L 21/50* | (2006.01) |
| *H01L 21/48* | (2006.01) |
| *H01L 23/00* | (2006.01) |
| *H01L 21/56* | (2006.01) |
| *H01L 23/495* | (2006.01) |
| *H01L 23/29* | (2006.01) |
| *H01L 23/31* | (2006.01) |

(52) U.S. Cl.
CPC .......... *H01L 21/4821* (2013.01); *H01L 21/56* (2013.01); *H01L 23/49513* (2013.01); *H01L 24/83* (2013.01); *H01L 24/85* (2013.01); *H01L 24/92* (2013.01); *H01L 23/293* (2013.01); *H01L 23/3107* (2013.01); *H01L 23/49582* (2013.01); *H01L 24/05* (2013.01); *H01L 24/45* (2013.01); *H01L 2224/04042* (2013.01); *H01L 2224/05624* (2013.01); *H01L 2224/45147* (2013.01); *H01L 2224/45664* (2013.01); *H01L 2224/83359* (2013.01); *H01L 2224/85359* (2013.01); *H01L 2224/92247* (2013.01)

(58) Field of Classification Search
CPC ... H01L 21/56; H01L 23/49513; H01L 24/83; H01L 24/85; H01L 24/92
USPC .......................................................... 438/123
See application file for complete search history.

(56) References Cited

U.S. PATENT DOCUMENTS

| | | | |
|---|---|---|---|
| 9,640,466 B1 * | 5/2017 | Mathew | H01L 23/4952 |
| 2013/0193575 A1 * | 8/2013 | Shen | H01L 24/03 |
| | | | 257/751 |
| 2013/0200506 A1 * | 8/2013 | Park | H01L 21/568 |
| | | | 257/676 |

FOREIGN PATENT DOCUMENTS

JP       2000-340599 A     12/2000

* cited by examiner

Primary Examiner — Luan C Thai
(74) Attorney, Agent, or Firm — McDermott Will & Emery LLP

(57) ABSTRACT

After a die bonding step, a wire bonding step is performed to electrically connect the plurality of pad electrodes and the plurality of leads of the semiconductor chip via a plurality of copper wires. A plating layer is formed on a surface of the lead, and a copper wire is connected to the plating layer in the wire bonding step. The plating layer is a silver plating layer. After the die bonding step, an oxygen plasma treatment is performed on the lead frame and the semiconductor chip before the wire bonding step, and then the surface of the plating layer is reduced.

20 Claims, 26 Drawing Sheets

FIG. 22

| | FIRST STUDY EXAMPLE (Fig. 19) | SECOND STUDY EXAMPLE (Fig. 20) | EMBODIMENT (Fig. 7) |
|---|---|---|---|
| ALLOYING RATIO | AVERAGE 67% | AVERAGE 81% | AVERAGE 80% |
| TENSILE STRENGTH | AVERAGE 8.0 gf | AVERAGE 11.0 gf | AVERAGE 11.5 gf |

FIG. 23

|  | SURFACE COMPOSITION (%) | | |
| --- | --- | --- | --- |
|  | Ag | C | O |
| BEFORE OXYGEN PLASMA TREATMENT | 97.5 | 2.3 | 0 |
|  | 97.6 | 2.3 | 0 |
|  | 97.7 | 2.3 | 0 |
| BEFORE REDUCTION TREATMENT AND AFTER OXYGEN PLASMA TREATMENT | 95.1 | 2.0 | 2.8 |
|  | 95.5 | 1.5 | 3.0 |
|  | 97.5 | 1.4 | 1.0 |
| AFTER REDUCTION TREATMENT | 97.5 | 2.5 | 0 |
|  | 97.5 | 2.4 | 0 |
|  | 97.7 | 2.2 | 0 |

FIG. 25

Reaction formula 1 : $2Ag + C + 3O \rightarrow Ag_2CO_3$

Reaction formula 2 : $Ag_2CO_3 \rightarrow Ag_2O + CO_2 \uparrow$

Reaction formula 3 : $2Ag_2O \rightarrow 4Ag + O_2 \uparrow$

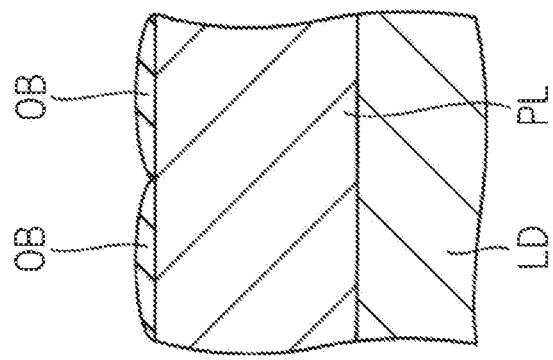

METHOD FOR MANUFACTURING A SEMICONDUCTOR DEVICE

CROSS-REFERENCE TO RELATED APPLICATIONS

The disclosure of Japanese Patent Application No. 2018-209988 filed on Nov. 7, 2018 including the specification, drawings and abstract is incorporated herein by reference in its entirety.

BACKGROUND OF THE INVENTION

The present invention relates to a method of manufacturing a semiconductor device, and can be suitably used, for example, in a method of manufacturing a semiconductor device including a wire bonding step.

A semiconductor device in a semiconductor package form can be manufactured by mounting a semiconductor chip on a die pad, electrically connecting pad electrodes and leads of the semiconductor chip via wires, and sealing them with resin. Wires include gold, copper or aluminum wires.

In Japanese Unexamined Patent Application No. 2000-340599, there is disclosed a technique related to wire bonding.

SUMMARY OF THE INVENTION

It is desired to improve the reliability of a semiconductor device using a copper wire.

Other objects and novel features will become apparent from the description of this specification and the accompanying drawings.

According to one embodiment, a method of manufacturing a semiconductor device includes: (a) a step of preparing a lead frame including a plurality of leads, and a chip mounting portion, each of the plurality of leads having a surface on which a silver plating layer is formed; and (b) a step of mounting a semiconductor chip on the chip mounting portion of the lead frame via a bonding material. The method of manufacturing a semiconductor device further includes: (c) performing oxygen plasma treatment on the lead frame and the semiconductor chip after the process (b); (d) reducing the surface of the silver plating layer after the step (c); and (e) electrically connecting a plurality of pad electrodes of the semiconductor chip and the plurality of leads via a plurality of copper wires after the step (d). In the step (e), the plurality of copper wires is connected to the plurality of leads, respectively, via the silver plating layer. According to one embodiment, reliability of the semiconductor device can be improved.

BRIEF DESCRIPTION OF THE DRAWINGS

FIG. 22 is a table showing the results of examining the alloying ratio at the interface between the copper wire and the pad electrode and the tensile strength of the joint between the copper wire and the pad electrode.

FIG. 23 is a table showing the results of the composition analysis of the surface of the plating layer.

FIG. 25 is an explanatory view for explaining the reaction on the surface of the plating layer.

FIGS. 26A-26C are explanatory views for explaining the state of the surface of the plating layer.

DESCRIPTIONS OF THE PREFERRED EMBODIMENTS

Figure 1:
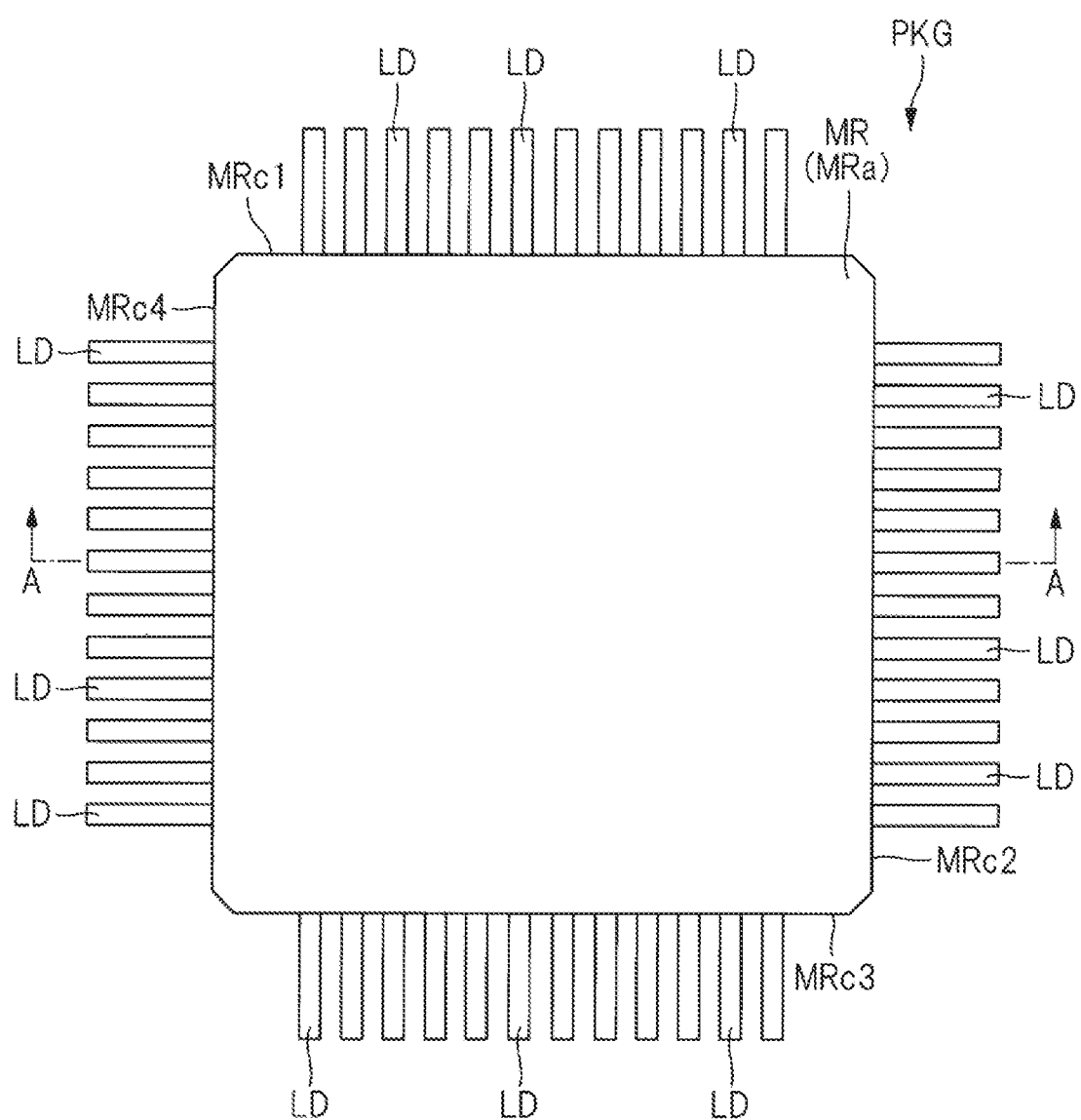
FIG. 1 is a top view of a semiconductor device according to an embodiment.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

DETAILED DESCRIPTION OF THE INVENTION

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see even in a cross-sectional view. In addition, even in a plan view, hatching may be used to make the drawing easier to see.

Embodiment

<Structure of Semiconductor Device>

Figure 2:
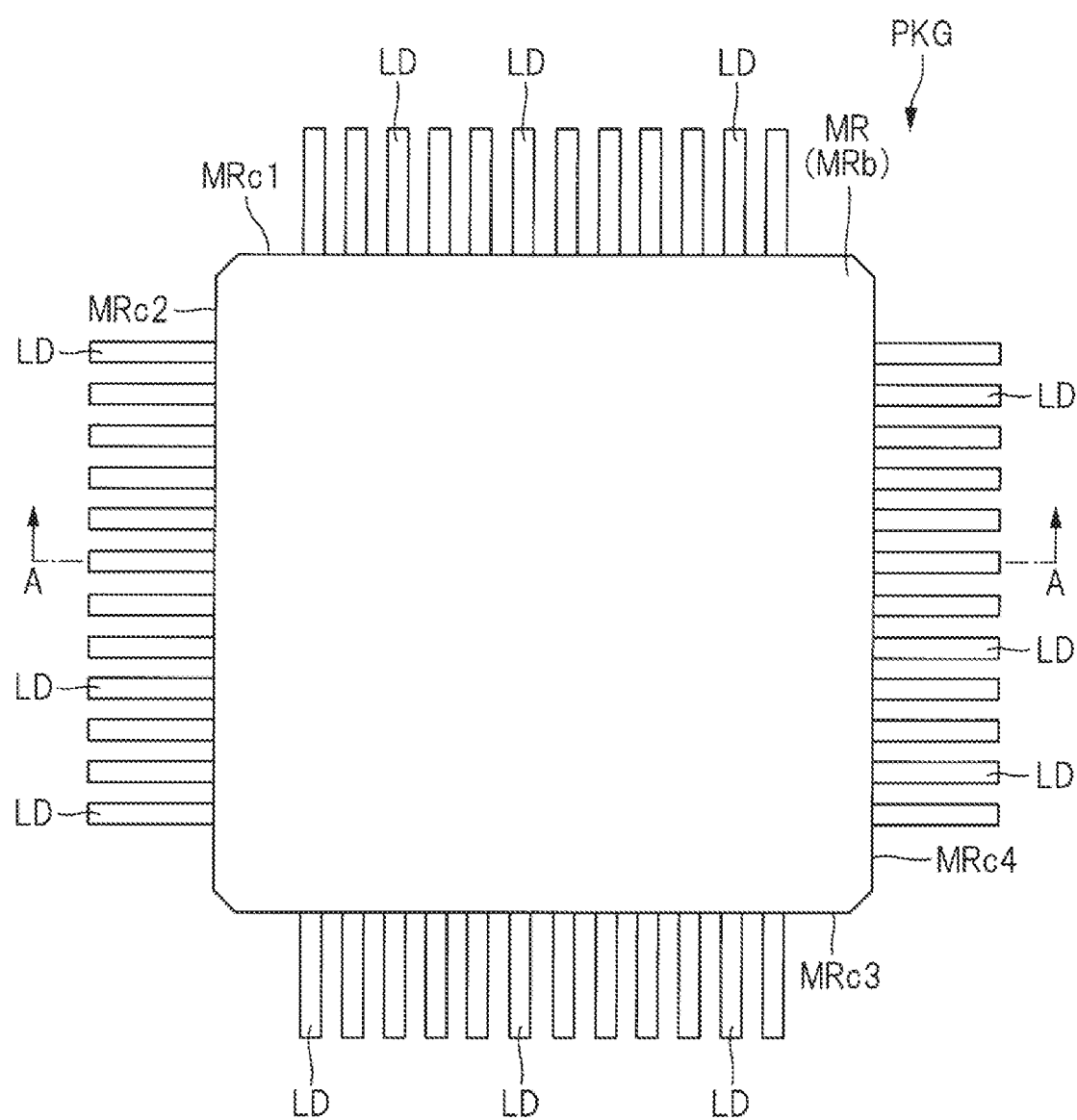
FIG. 2 is a bottom view of a semiconductor device according to an embodiment.

A semiconductor device according to an embodiment of the present invention will be described with reference to the drawings. FIG. 1 is a top view of a semiconductor device PKG according to an embodiment of the present invention, FIG. 2 is a bottom view of the semiconductor device PKG, FIGS. 3 to 5 are plan perspective views of the semiconductor device PKG, and FIG. 6 is a cross-sectional view of the semiconductor device PKG.

Figure 3:
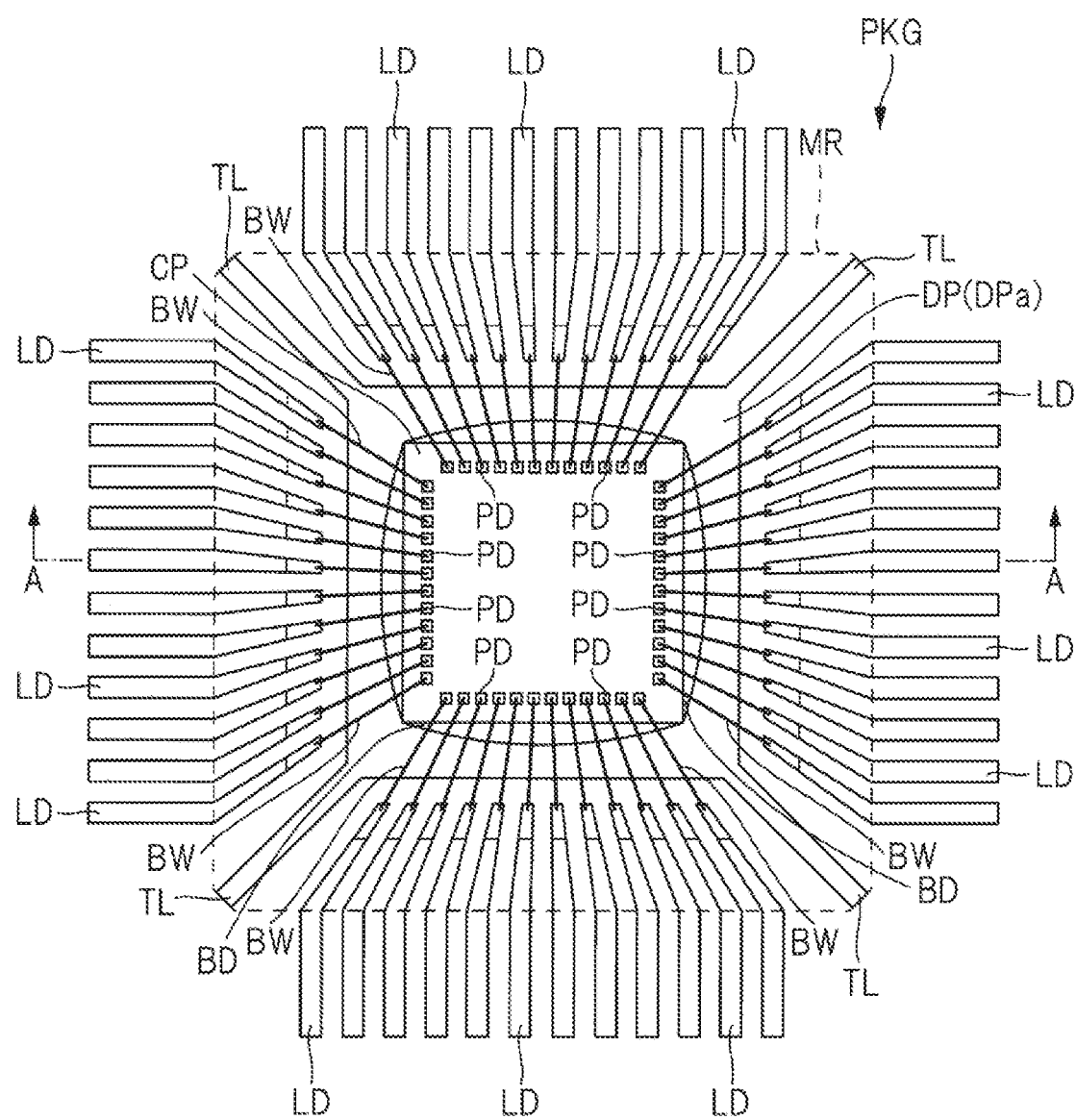
FIG. 3 is a plan perspective view of a semiconductor device according to an embodiment.

FIG. 3 is a plan perspective view of the upper surface side of the semiconductor device PKG when the sealing portion MR is seen through. FIG. 4 is a plan perspective view of the upper surface side of the semiconductor device PKG when the wire BW is further seen (omitted) in FIG. 3.

Figure 4:
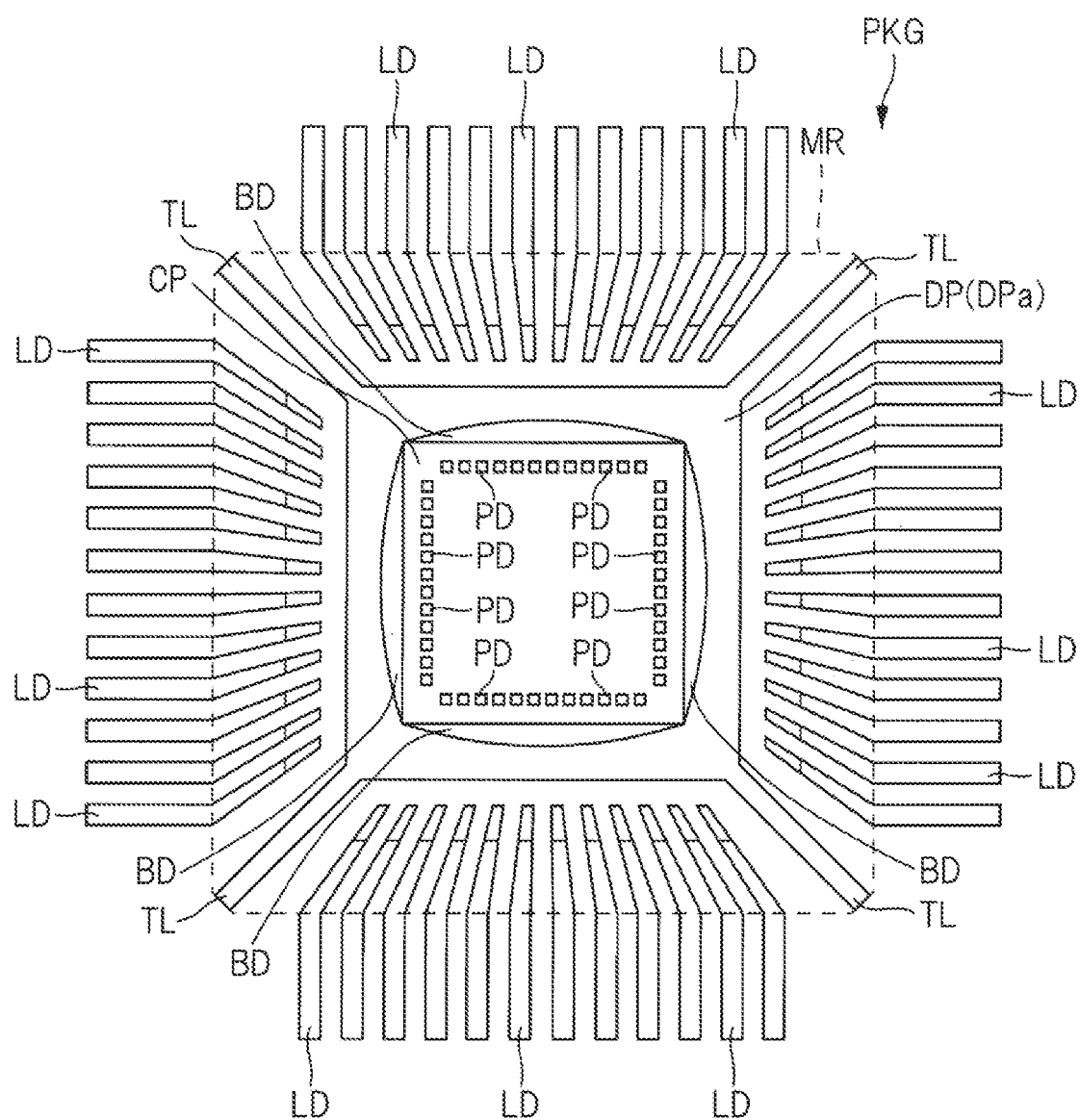
FIG. 4 is a plan perspective view of a semiconductor device according to an embodiment.
Figure 5:
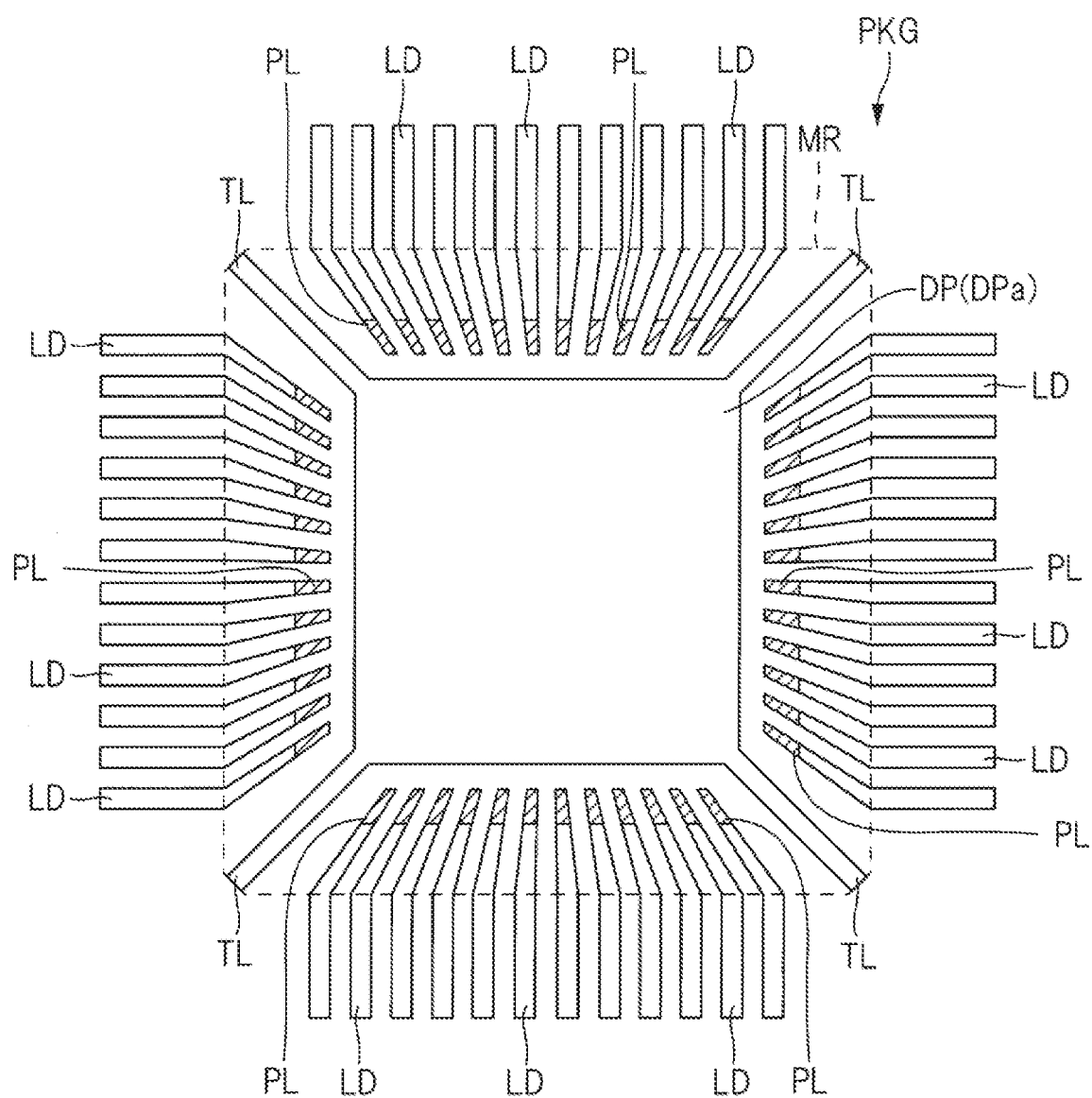
FIG. 5 is a plan perspective view of a semiconductor device according to an embodiment.
Figure 6:
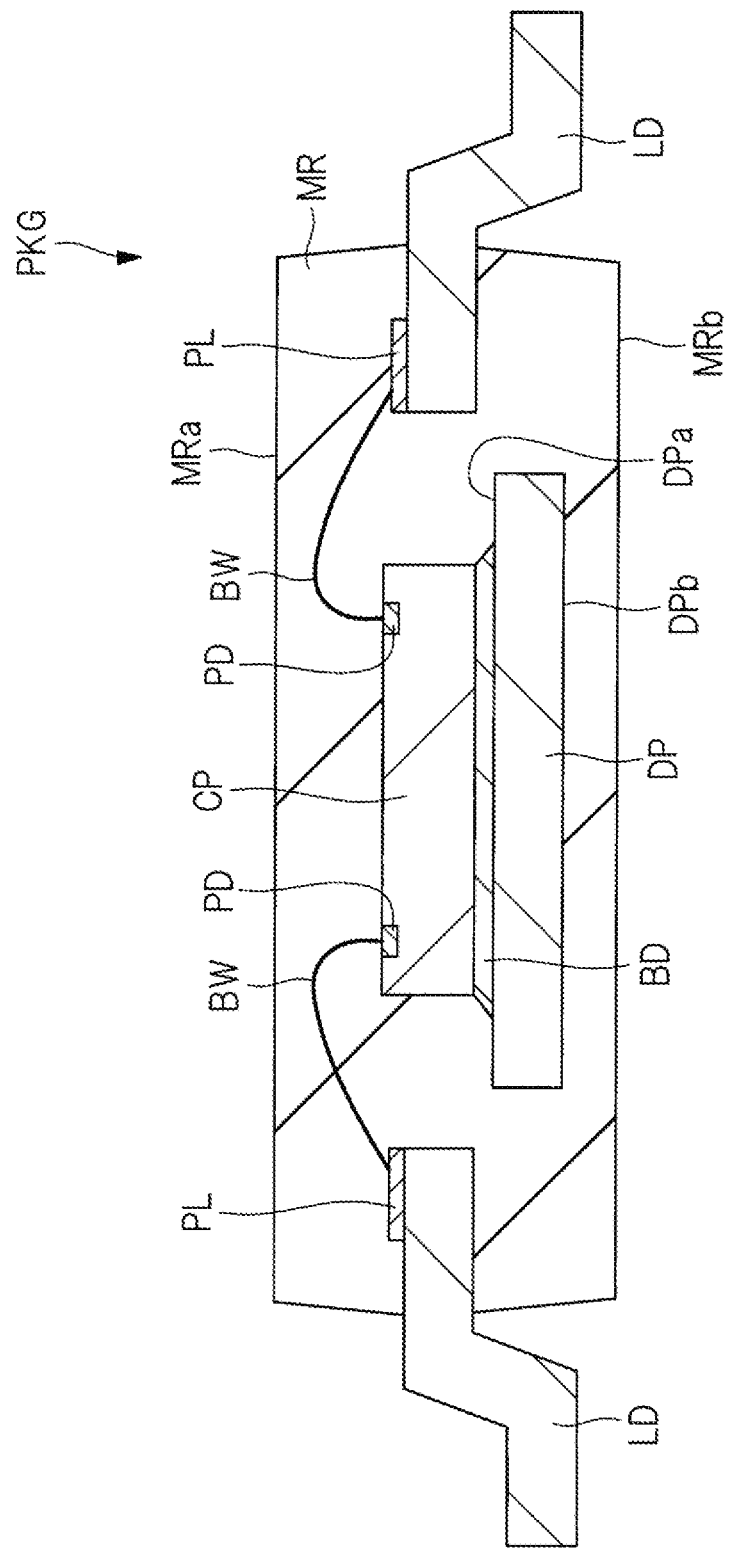
FIG. 6 is a cross-sectional view of a semiconductor device according to an embodiment.

FIG. 5 is a plan perspective view of the upper surface side of the semiconductor device PKG when the semiconductor chip CP and the bonding material BD are further viewed (omitted) in FIG. 4. FIG. 5 is a plan view, but in order to simplify understanding, the plating layer PL formed on the upper surface of the inner lead portion of the lead LD is hatched.

In FIGS. 1 and 3 to 5, the orientation of the semiconductor device PKG is the same, and in FIGS. 3 to 5, the position of the outer periphery of the sealing portion MR is indicated by a dotted line. The cross section of the semiconductor device PKG at the position A-A in FIGS. 1 to 3 substantially corresponds to FIG. 6.

The semiconductor device (semiconductor package) PKG of the present embodiment shown in FIGS. 1 to 6 is a semiconductor device in the form of a resin-sealed semiconductor package, and here is a semiconductor device in the form of a Quad Flat Package (QFP). Hereinafter, the configuration of the semiconductor device PKG will be described with reference to FIGS. 1 to 6.

The semiconductor device PKG of the present embodiment shown in FIGS. 1 to 6 includes a semiconductor chip CP, a die pad DP mounting the semiconductor chip CP, a plurality of leads LD formed by conductors, a plurality of wires BW electrically connecting the plurality of pad electrodes PD of the semiconductor chip CP and the plurality of leads LD, and a sealing portion (sealing body) MR sealing these.

The sealing portion MR as a resin sealing portion (resin sealing body) is made of, for example, a resin material such as a thermosetting resin material, and may include a filler or the like. For example, the sealing portion MR can be formed using an epoxy resin containing a filler or the like. In addition to the epoxy resin, a biphenyl-based thermosetting resin to which a phenolic curing agent, a silicone rubber, a filler, and the like are added may be used as a material of the sealing portion MR for the reason of reducing stress and the like.

The sealing portion MR has a top surface MRa which is one main surface, a lower surface MRb which is a main surface opposed to the top surface MRa, and a side surface MRc1, MRc2, MRc3, MRc4 which intersects the top surface MRa and the bottom surface MRb. That is, the outer appearance of the sealing portion MR is a thin plate shape surrounded by the upper surface MRa, the lower surface MRb, and the side surfaces MRc1, MRc2, MRc3, MRc4.

The planar shape of the sealing portion MR, that is, the planar shape of the upper surface MRa and the lower surface MRb of the sealing portion MR is, for example, a rectangular shape (square shape), and the corner of the rectangular shape can be rounded, or any corner of the four corners of the rectangular shape can be dropped (chamfered).

Part of each of the plurality of leads LD is sealed in the sealing portion MR, and the other part protrudes from the side surface of the sealing portion MR to the outside of the sealing portion MR. Hereinafter, a portion of the lead LD located inside the sealing portion MR is referred to as an inner lead portion, and a portion of the lead LD located outside the sealing portion MR is referred to as an outer lead portion.

The semiconductor device PKG of the present embodiment has a structure in which a part of each lead LD (outer lead portion) protrudes from the side surface of the sealing portion MR, and will be described below based on this structure, but is not limited to this structure. For example, a configuration in which each lead LD hardly protrudes from the side surface of the sealing portion MR and a portion of each lead LD is exposed at the lower surface MRb of the sealing portion MR (a Quad Flat Non leaded package (QFN) type configuration) or the like may be employed.

The die pad DP is a chip mounting portion on which the semiconductor chip CP is mounted. The planar shape of the die pad DP is, for example, a rectangular shape. The die pad DP has a top surface DPa which is one main surface, a bottom surface DPb which is a main surface on the other side of the top surface DPa, a side surface along a side surface MRc1 of the sealing portion MR, a side surface along a side surface MRc2 of the sealing portion MR, a side surface along a side surface MRc3 of the sealing portion MR, and a side surface along a side surface MRc4 of the sealing portion MR.

The die pad DP is sealed in the sealing portion MR. The upper surface DPa, the side surface, and the lower surface DPb of the die pad DP are not exposed from the sealing portion MR. Although FIGS. 2 and 6 show the case where the lower surface DPb of the die pad DP is covered with the sealing portion MR, that is, the case where the lower surface DPb of the die pad DP is not exposed from the lower surface MRb of the sealing portion MR, as another mode, the lower surface DPb of the die pad DP may be exposed from the lower surface MRb of the sealing portion MR.

The die pad DP and the plurality of leads LD are made of a conductor, preferably made of a metal material containing copper (Cu) as a main component, and specifically made of copper (Cu) or a copper alloy. The content of copper (Cu) in the die pad DP and the plurality of leads LD is preferably about 95 atomic % or more. In addition, it is preferable that the die pad DP and the plurality of leads LD are formed of the same material, which facilitates manufacturing of a lead frame in which the die pad DP and the plurality of leads LD are connected, thereby facilitating manufacturing of the semiconductor device PKG using the lead frame.

The plurality of leads LD included in the semiconductor device PKG is arranged around the die pad DP in plan view. The plan view corresponds to the case where the die pad DP is viewed in a plane substantially parallel to the upper surface DPa. Therefore, the plurality of leads LD included in the semiconductor device PKG is composed of a plurality of leads LD arranged on the side surface MRc1 of the sealing portion MR, a plurality of leads LD arranged on the side surface MRc2 of the sealing portion MR, a plurality of leads LD arranged on the side surface MRc3 of the sealing portion MR, and a plurality of leads LD arranged on the side surface MRc4 of the sealing portion MR.

The outer lead portions of the plurality of leads LDs arranged on the side surface MRc1 of the sealing portion MR project from the side surface MRc1 of the sealing portion MR to the outside of the sealing portion MR. The outer lead portions of the plurality of leads LDs disposed on the side MRc2 the side surface of the sealing portion MR project from the side surface MRc2 of the sealing portion MR to the outside of the sealing portion MR. The outer lead portions of the plurality of leads LDs disposed on the side MRc3 the side surface of the sealing portion MR project from the side surface MRc3 of the sealing portion MR to the outside of the sealing portion MR. The outer lead portions of the plurality of leads LDs disposed on the side MRc4 the side surface of the sealing portion MR project from the side surface MRc4 of the sealing portion MR to the outside of the sealing portion MR.

The outer lead portion of each lead LD is bent so that the lower surface in the vicinity of the end portion of the outer lead portion is positioned substantially on the same plane as the lower surface MRb of the sealing portion MR. The outer lead portion of the lead LD functions as an external connection terminal portion of the semiconductor device PKG.

Suspension leads TL are integrally connected to the four corners of the rectangle constituting the planar shape of the die pad DP, and the suspension leads TL extend in the sealing portion MR toward the four corners of the sealing portion MR having the planar rectangular shape. Each suspension lead TL is formed integrally with the die pad DP by the same material as the die pad DP. A portion of the suspension lead TL protruding from the sealing portion MR after the sealing portion MR is formed is cut, and a cut surface (end surface) generated by the cutting of the suspension lead TL is exposed at four corner side surfaces of the sealing portion MR.

On the upper surface DPa of the die pad DP, a semiconductor chip CP is mounted with its front surface (upper surface) facing upward and its back surface (lower surface) facing toward the die pad DP. In the case of FIGS. 3, 4, and 6, the planar dimension (planar area) of the die pad DP is greater than the planar dimension (planar area) of the semiconductor chip CP, and the semiconductor chip CP is included in the upper surface of the die pad DP in plan view.

Here, in the semiconductor chip CP, the main surface on the side on which the plurality of pad electrodes PD is formed, out of the two main surfaces located on opposite sides of each other, is referred to as the front surface (upper surface) of the semiconductor chip CP, and the main surface on the side opposite to this front surface and facing the die pad DP is referred to as the back surface of the semiconductor chip CP.

The semiconductor chip CP is manufactured by, for example, forming various semiconductor elements or semiconductor integrated circuits on a main surface of a semiconductor substrate (semiconductor wafer) made of single crystal silicon or the like, and then separating the semiconductor substrate into semiconductor chips by dicing or the like. The planar shape of the semiconductor chip CP is a rectangular shape.

The semiconductor chip CP is mounted on the upper surface DPa of the die pad DP via a bonding material layer BD. That is, the back surface of the semiconductor chip CP is bonded and fixed to the upper surface DPa of the die pad DP via the bonding material BD. The semiconductor chip CP is sealed in the sealing portion MR and is not exposed from the sealing portion MR.

As the bonding material BD, a conductive bonding material or an insulating bonding material can be used. When a conductive bonding material is used as the bonding material BD, for example, a conductive paste type bonding material such as silver paste can be suitably used, but solder can also be used. In the manufactured semiconductor device PKG, the bonding material BD has already been cured or solidified. When the back electrode is formed on the back surface of the semiconductor chip CP, the back electrode of the semiconductor chip CP can be electrically connected to the die pad DP via the conductive bonding material BD by using the conductive bonding material as the bonding material BD.

As another mode, a plating layer, preferably a silver plating layer, may be provided on the upper surface DPa of the die pad DP, and the semiconductor chip CP may be mounted on the plating layer via the bonding material BD.

A plurality of pad electrodes PD is formed on the front surface of the semiconductor chip CP. The pad electrode PD is composed mainly of aluminum (Al) and, more specifically, is composed mainly of an aluminum layer or an aluminum alloy layer. That is, the pad electrode PD is an aluminum pad. The plurality of pad electrodes PD of the semiconductor chip CP and the plurality of leads LD are electrically connected to each other via a plurality of wires (bonding wires, copper wires) BW. That is, one end of each wire BW is connected to the pad electrode PD of the semiconductor chip CP, and the other end of each wire BW is connected to the lead LD, specifically, the plating layer PL formed on the upper surface of the inner lead portion of the lead LD, whereby the pad electrode PD of the semiconductor chip CP and the lead LD are electrically connected via the wire BW. Each pad electrode PD of the semiconductor chip CP is electrically connected to an internal circuit formed in the semiconductor chip CP.

In plan view, each side of the semiconductor chip CP is substantially parallel to each side of the die pad DP, and therefore, is substantially parallel to each side surface of the sealing portion MR. A plurality of pad electrodes PD arranged along the side MRc1 to the side surface of the semiconductor chip CP is electrically connected to a plurality of leads LD arranged on the side MRc1 to the sealing portion MR via a plurality of wires BW. In addition, a plurality of pad electrodes PD arranged along the side on the side surface MRc2 of the front surface of the semiconductor chip CP is electrically connected to a plurality of leads LD arranged on the side surface MRc2 of the sealing portion MR via a plurality of wires BW. In addition, a plurality of pad electrodes PD arranged along the side surface MRc3 side on the front surface of the semiconductor chip CP is electrically connected to a plurality of leads LD arranged on the side surface MRc3 side of the sealing portion MR via a plurality of wires BW. In addition, a plurality of pad electrodes PD arranged along the side on the side surface MRc4 of the front surface of the semiconductor chip CP is electrically connected to a plurality of leads LD arranged on the side surface MRc4 of the sealing portion MR via a plurality of wires BW.

The wire (bonding wire) BW is a conductive connection member and has conductivity, and specifically, is a copper (Cu) wire.

The copper wire (wire BW) is made of a conductor wire containing copper as a main component, but may have a structure in which a palladium (Pd) layer is coated around the conductor wire containing copper as a main component. In other words, the copper wire (wire BW) may include a conductor wire (copper wire) containing copper as a main component, and a palladium (Pd) layer formed around the conductor wire (copper wire). The palladium layer has a function of preventing oxidation of a conductor wire containing copper as a main component. The palladium layer has a function of preventing the conductor wire containing copper as a main component from reacting with the sulfur or halogen element contained in the sealing portion MR. The conductor wire mainly composed of copper constituting the copper wire (wire BW) is made of copper or a copper alloy, and the content of copper is preferably 95 atomic % or more.

Since the wire BW is a copper (Cu) wire and is a hard material, a high bonding strength can be obtained by applying mechanical pressure to the wire BW and pressing the wire BW against the pad electrode PD. Further, since the copper (Cu) wire is cheaper than the gold (Au) wire, there is an advantage that the cost can be reduced.

The wire BW is sealed in the sealing portion MR and is not exposed from the sealing portion MR. In each lead LD, a connection point of the wire BW is an inner lead portion located in the sealing portion MR, more specifically, an upper surface of the inner lead portion.

Further, a plating layer (silver plating layer) PL is provided on the upper surface of the inner lead portion of each lead LD. The plating layer PL is formed on at least a part of the upper surface of the inner lead portion of the lead LD. The plating layer PL is preferably a silver (Ag) plating layer. That is, the plating layer PL is preferably a silver layer (Ag layer) formed by a plating method. One end of each wire BW, that is, the end opposite to the side connected to the pad electrode PD, is connected to the plating layer PL on the upper surface of the inner lead portion of the lead LD. By connecting the wire BW to the plating layer PL on the upper surface of the inner lead portion of the lead LD, the connection strength of the wire BW can be increased.

In the case of FIGS. 5 and 6, the plating layer PL is formed on a part of the upper surface of the inner lead portion of the lead LD. As another mode, the plating layer PL may be formed on the entire upper surface of the inner lead portion of the lead LD. As still another mode, it is possible to form the plating layer PL not only on the upper surface of the inner lead portion of the lead LD but also on the side surface of the inner lead portion of the lead LD, it is also possible to form the plating layer PL on the lower surface of the inner lead portion of the lead LD, and it is also possible to form the plating layer PL on the distal end surface of the inner lead portion of the lead LD.

However, since the adhesion between the plating layer PL and the sealing portion MR is lower than the adhesion between the surface of the lead LD and the sealing portion MR in the region where the plating layer PL is not formed, it is not desirable to make the area of the plating layer PL greater than necessary. Therefore, it is more preferable to form the plating layer PL on a part of the upper surface of the inner lead portion of the lead LD than to form the plating layer PL on the entire upper surface of the inner lead portion of the lead LD, because the adhesion of the sealing portion MR can be enhanced. Further, it is more preferable to form the plating layer PL on the side surface or the bottom surface of the inner lead portion of the lead LD than to form the plating layer PL on the side surface or the bottom surface of the inner lead portion of the lead LD because the adhesion of the sealing portion MR can be enhanced.

Therefore, it is preferable that the plating layer PL is formed in the inner lead portion of the lead LD in the region where the wire BW is connected and in the vicinity thereof, and therefore, it is preferable that the plating layer PL is formed on the upper surface in the vicinity of the distal end portion of the inner lead portion of the lead LD.

<Manufacturing Process of Semiconductor Device>

Figure 7:
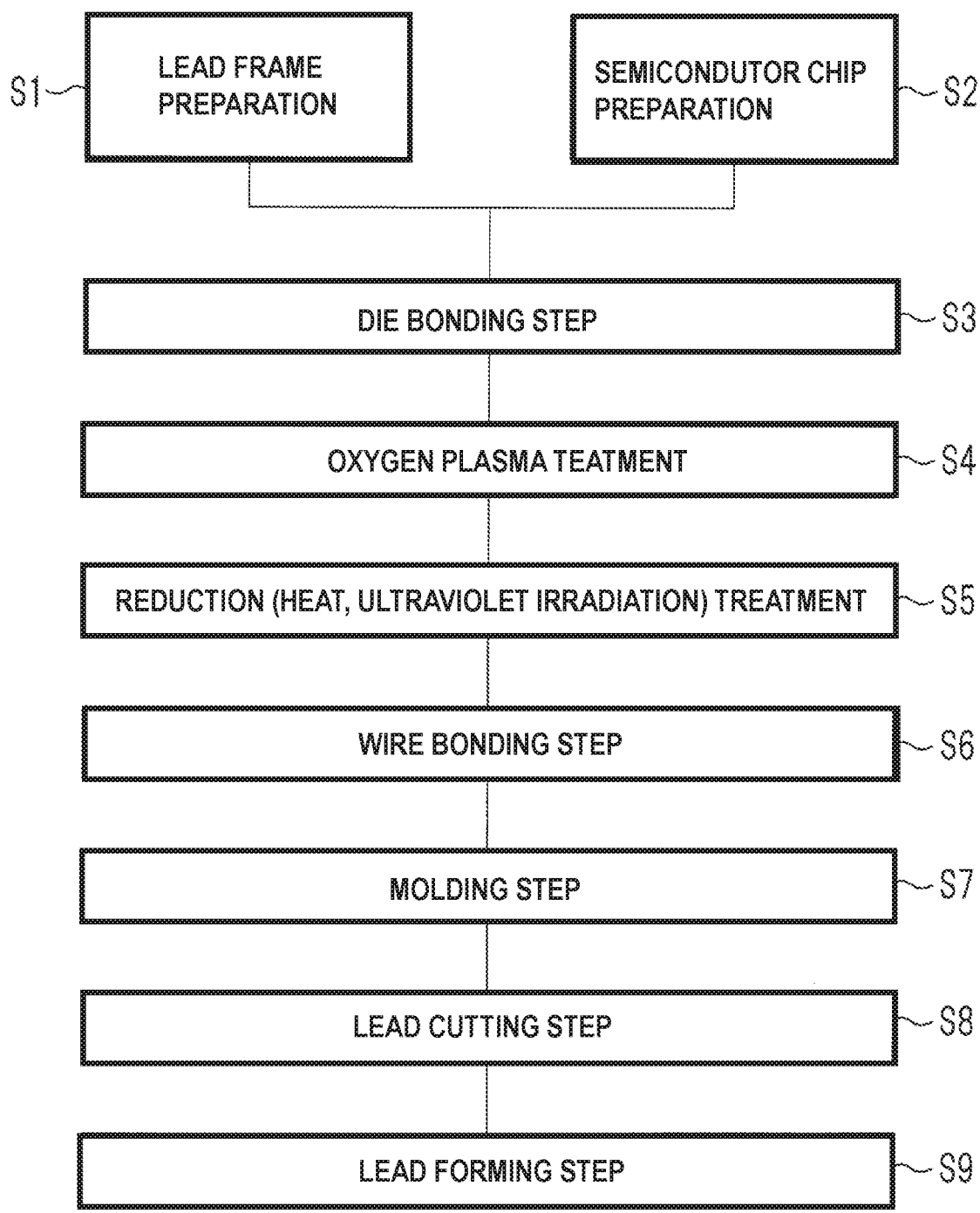
FIG. 7 is a process flow diagram showing a manufacturing process of a semiconductor device according to an embodiment.
Figure 8:
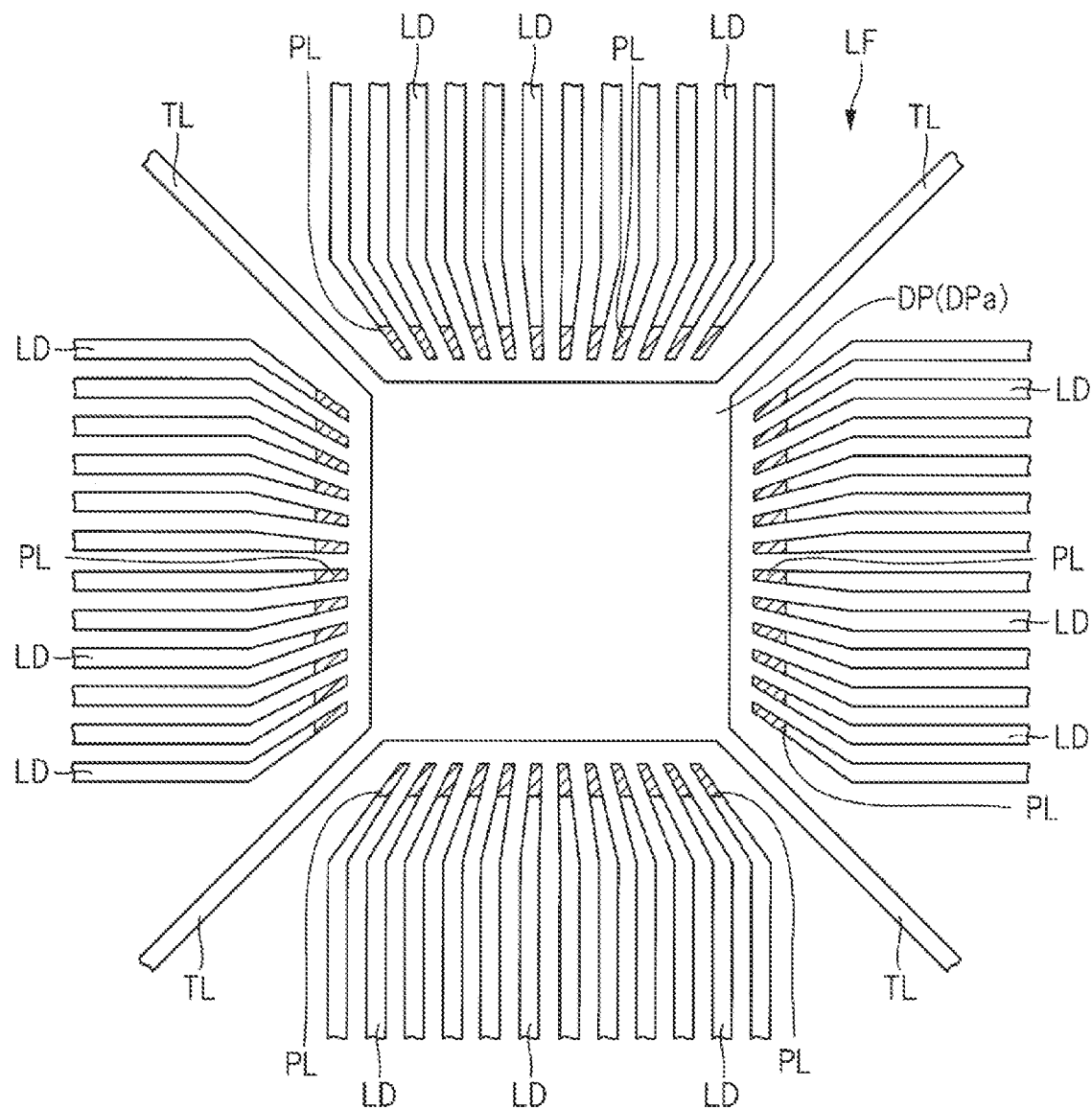
FIG. 8 is a plan view showing a lead frame for manufacturing a semiconductor device according to an embodiment.

Next, a manufacturing process of the semiconductor device PKG shown in FIGS. 1 to 6 will be described. FIG. 7 is a process flow diagram showing a manufacturing process of the semiconductor device PKG shown in FIGS. 1 to 6. FIGS. 8 to 17 are plan views or cross-sectional views during the manufacturing process of the semiconductor device PKG. Among FIGS. 8 to 17, FIG. 8, FIG. 10, FIG. 13 and FIG. 15 are plan views, FIG. 9, FIG. 11, FIG. 12, FIG. 14, FIG. 16 and FIG. 17 are cross-sectional views, and cross-sectional views corresponding to FIG. 6 are shown. FIG. 8 is a plan view, but in order to simplify understanding, the plating layer PL formed on the upper surface of the inner lead portion of the lead LD is hatched.

In order to manufacture the semiconductor device PKG, first, the lead frame LF is prepared (step S1 in FIG. 7) and the semiconductor chip CP is prepared (step S2 in FIG. 7). Either the lead frame LF or the semiconductor chip CP may be prepared first or simultaneously.

Figure 9:
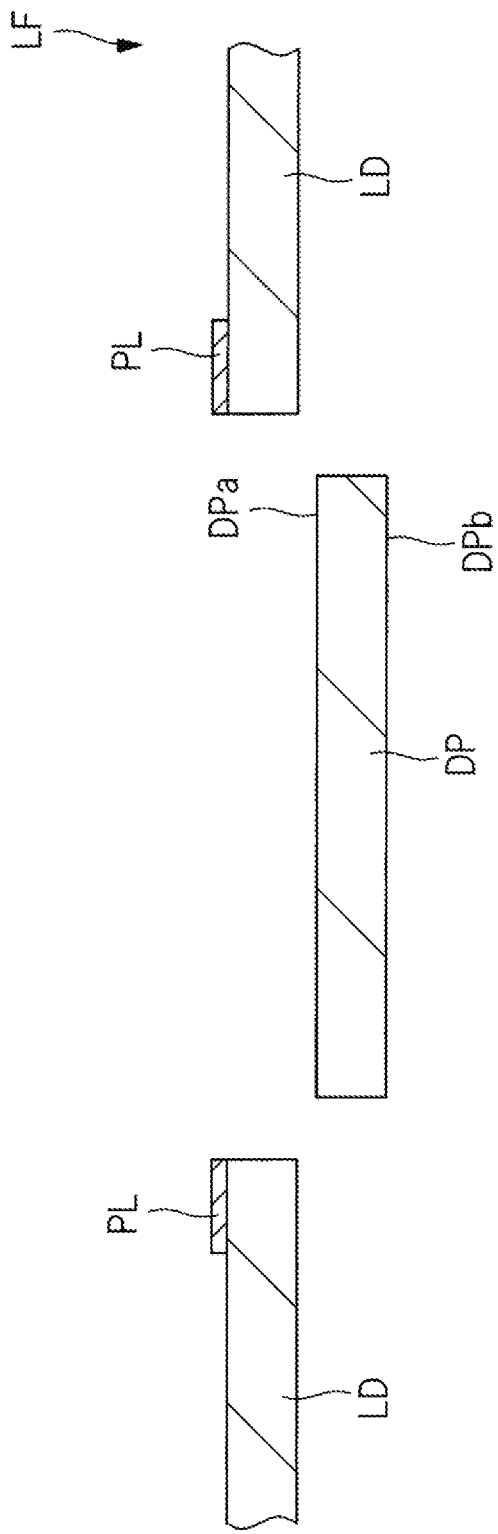
FIG. 9 is a cross-sectional view of the lead frame of FIG. 8.

As shown in FIGS. 8 and 9, the lead frame LF integrally includes a frame (not shown), a plurality of lead LDs coupled to the frame, and a die pad DP coupled to the frame via a plurality of suspension leads TL. The lead frame LF is made of a metal material containing copper (Cu) as a main component, and specifically, is made of copper (Cu) or a copper (Cu) alloy. The content of copper in the lead frame LF is preferably 95 atomic % or more.

A plating layer PL is formed on the top surface of the tip of each lead LD of the lead frame LF. The plating layer PL can be formed by a plating method, preferably an electrolytic plating method. Hereinafter, the main surface of the lead frame including the upper surface DPa of the die pad DP and the upper surface of the lead LD on which the plating layer PL is formed is referred to as the upper surface of the lead frame LF.

The lead frame LF can be manufactured by processing a metal plate (copper plate or copper alloy plate), but after the metal plate is processed to manufacture the lead frame LF, a plating layer PL on the upper surface of the inner lead portion of the lead LD of the lead frame LF is formed by using a plating method (preferably, an electrolytic plating method). As a result, a lead frame LF integrally including the die pad DP and the plurality of leads LD on which the plating layer PL is formed can be prepared.

A plating layer may be formed on the upper surface DPa of the die pad DP of the lead frame LF. In this case, the plating layer on the upper surface of the die pad DP of the lead frame LF and the plating layer PL on the upper surface of the inner lead portion of the lead LD of the lead frame LF can be formed by the same plating process, and in this case, both of them are made of the same material, preferably silver.

Figure 10:
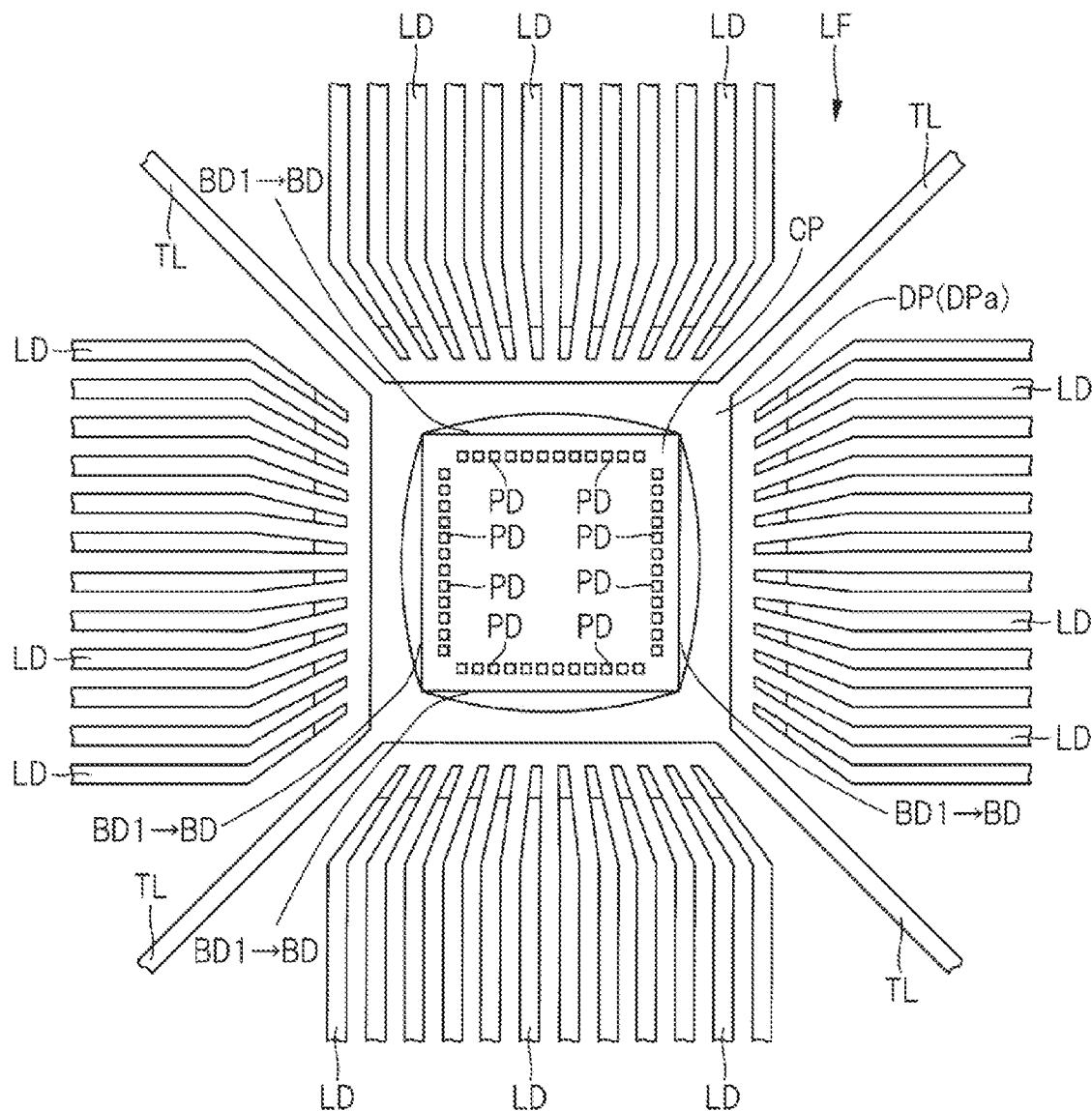
FIG. 10 is a plan view showing a die bonding process.
Figure 11:
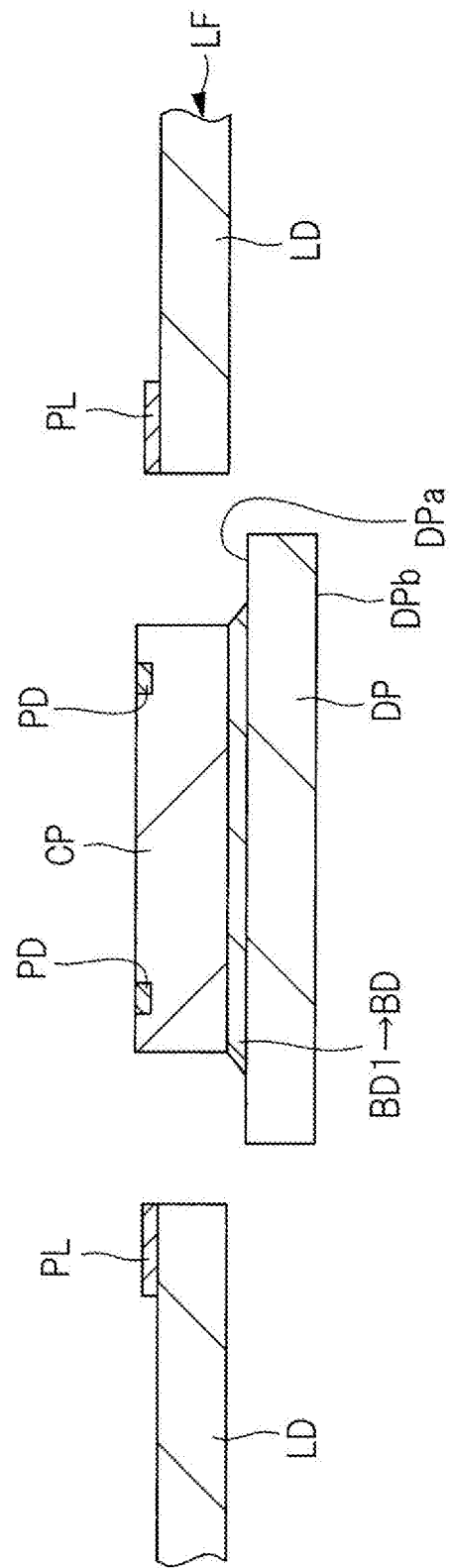
FIG. 11 is a cross-sectional view showing a die bonding process.

Next, as shown in FIGS. 10 and 11, a die bonding process of the semiconductor chip CP is performed to mount the semiconductor chip CP on the die pad DP of the lead frame LF via the bonding material BD and bond the semiconductor chip CP (step S3 in FIG. 7). Specifically, the die bonding process of step S3 can be performed as follows.

That is, first, the bonding material BD1 is supplied (applied) onto the upper surface DPa of the die pad DP of the lead frame LF. As the bonding material BD1, a conductive paste type bonding material (adhesive) such as a silver (Ag) paste can be suitably used, but an insulating paste type bonding material or a solder paste can also be used. In addition, a film-type bonding material can be used as the bonding material BD1.

The bonding material BD1 is supplied (applied) to the chip mounting region (region where the semiconductor chip CP is to be mounted) on the upper surface DPa of the die pad DP of the lead frame.

Then, the semiconductor chip CP is arranged in a chip mounting region of the upper surface DPa of the die pad DP of the lead frame. At this time, the semiconductor chip CP is disposed on the upper surface DPa of the die pad DP in a face-up manner so that the front surface side of the semiconductor chip CP faces upward and the back surface side of the semiconductor chip CP faces downward, that is, the upper surface DPa side of the die pad DP. That is, the semiconductor chip CP is disposed on the upper surface DPa of the die pad DP such that the back surface of the semiconductor chip CP faces the upper surface DPa of the die pad DP. As a result, the semiconductor chip CP is disposed on the upper surface DPa of the die pad DP via the bonding material BD1.

Then, a baking process is performed to cure the bonding material BD1. As a result, the bonding material BD1 is cured to form the bonding material B D.

The bonding material BD is obtained by curing the bonding material BD1. If a thermosetting resin material is used as the resin material contained in the bonding material BD1, the thermosetting resin material contained in the bonding material BD1 can be cured by heat treatment, thereby curing the bonding material BD1. The semiconductor chip CP is bonded and fixed to the die pad DP by the hardened bonding material BD1, i.e., the bonding material BD. When a solder paste is used as the bonding material BD1, the semiconductor chip CP may be disposed (mounted) in a chip mounting area of the upper surface DPa of the die pad DP of the lead frame, and then the solder reflow process may be performed. Thus, the semiconductor chip CP is bonded and fixed to the die pad DP via the melted and re-solidified solder.

When a plating layer is formed on the upper surface DPa of the die pad DP of the lead frame, the bonding material BD1 is supplied (applied) onto the plating layer, and then the semiconductor chip CP is disposed (mounted) on the plating layer on the upper surface DPa of the die pad DP via the bonding material BD1, and then the bonding material BD1 is cured by performing heat treatment.

Figure 12:
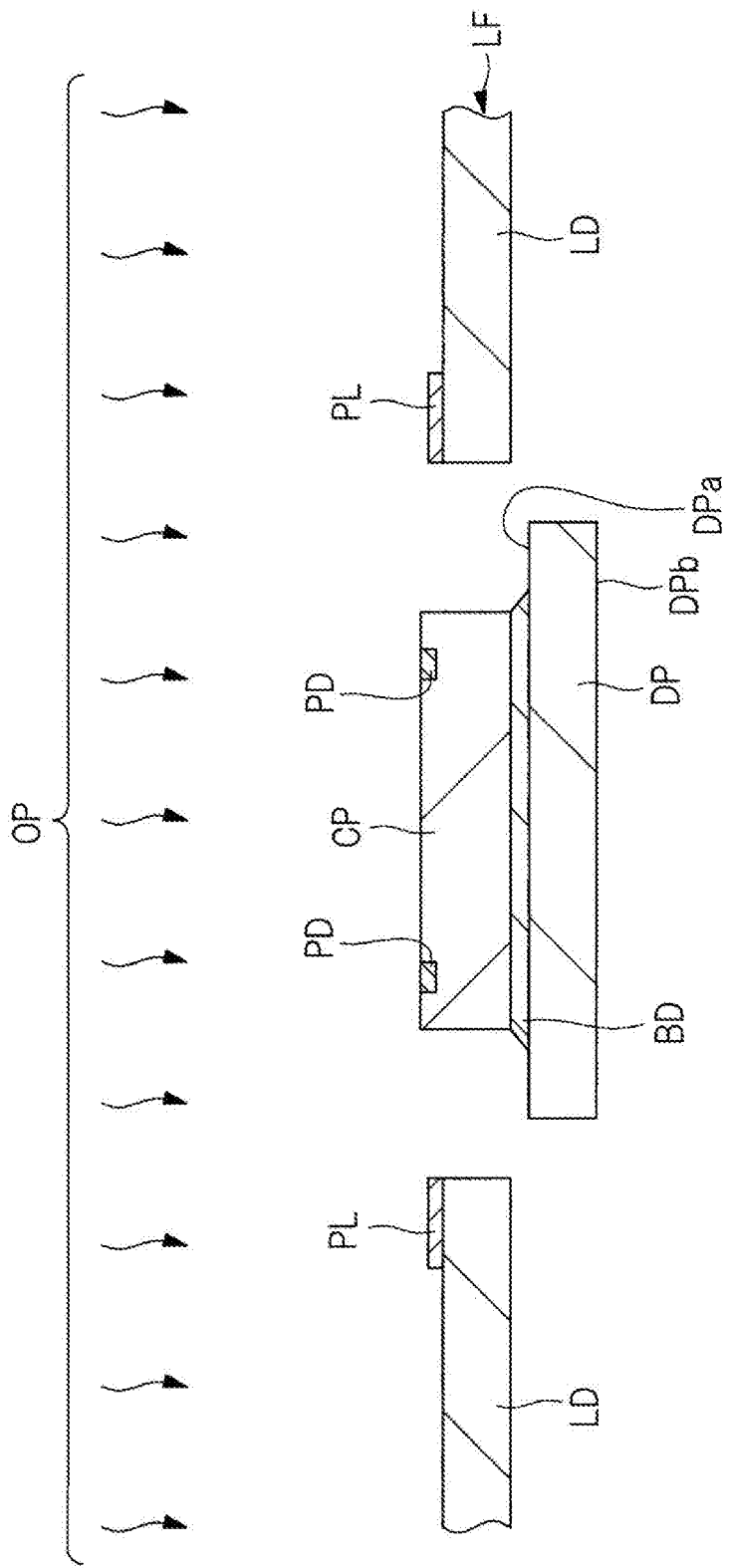
FIG. 12 is a cross-sectional view showing an argon plasma treatment step.

Next, as shown in FIG. 12, an oxygen ($O_2$) plasma treatment is performed (step S4 in FIG. 7). In step S4, the lead frame LF and the semiconductor chip CP are subjected to oxygen plasma treatment. The oxygen plasma treatment in step S4 is hereinafter referred to as an oxygen plasma treatment OP with reference code OP, and in FIG. 12, the oxygen plasma treatment OP in step S4 is schematically shown by an arrow.

By the oxygen plasma treatment OP, contaminants are removed from the surface of the plating layer PL, and the surface of the plating layer PL can be cleaned.

That is, oxygen plasma has the ability to chemically decompose organic matter. In addition, the contaminant adhering to the surface of the plating layer PL at the stage immediately before the step S4 is performed is mainly composed of an organic substance. Therefore, the contaminants adhering to the surface of the plating layer PL immediately before the step S4 can be decomposed and removed by the oxygen plasma treatment OP. Thus, the surface of the plating layer PL can be cleaned. Therefore, the oxygen plasma treatment OP can be regarded as an oxygen plasma cleaning treatment.

The oxygen plasma treatment OP has a function of removing contaminants on the surface of the plating layer PL, and also has a function of oxidizing the surface of the plating layer PL. Therefore, by performing the oxygen plasma treatment OP in step S4, the contaminant on the surface of the plating layer PL can be removed, but the surface of the plating layer PL is oxidized.

Next, in step S5 of FIG. 7, the lead frame LF and the semiconductor chip CP are subjected to a heat treatment as a reduction treatment of the plating layer PL.

The heat treatment in step S5 is performed to reduce the surface of the plating layer PL. That is, the heat treatment in step S5 is a treatment for reducing the oxidized portion of the plating layer PL. Although the surface of the plating layer PL is oxidized by the oxygen plasma treatment OP in step S4, the oxidized surface of the plating layer PL can be reduced by the heat treatment in step S5.

Note that the oxidation and reduction described here are oxidation and reduction in a broad sense, the reaction of losing electrons is oxidation, and the reaction of obtaining oxygen is reduction. Therefore, the surfaces of the plating layer PL can be regarded as oxidized not only when the silver (Ag) constituting the plating layer PL reacts with oxygen (O) to generate silver oxide ($Ag_2O$), but also when the silver (Ag) constituting the plating layer PL reacts with oxygen (O) and carbon (C) to generate silver carbonate ($Ag_2CO_3$). In addition, the surface of the oxidized plating layer PL can be considered to have been reduced not only when a reaction occurs in which silver oxide ($Ag_2O$) formed on the surface of the plating layer PL decomposes into silver (Ag) and oxygen ($O_2$), but also when a reaction occurs in which silver carbonate ($Ag_2CO_3$) formed on the surface of the plating layer PL decomposes into silver (Ag), oxygen ($O_2$) and carbon dioxide ($CO_2$).

When the oxygen plasma treatment OP of step S4 is performed, the surface of the plating layer PL is oxidized to form a thin oxide film (assumed to be a silver carbonate film from the results of FIGS. 23 and 24 described later) on the surface of the plating layer PL made of silver (Ag), but the oxide film (silver carbonate film) formed on the surface of the plating layer PL is reduced (reduced to silver) by the reduction treatment (heat treatment) of step S5. As a result, an oxide film (silver carbonate film) is not formed on the surface of the plating layer PL, and the silver (Ag) plating layer is exposed on the surface of the plating layer PL.

The temperature of the heat treatment in step S5 is preferably set to a temperature sufficient to reduce the surface of the plated layer PL oxidized by the oxygen plasma treatment OP, specifically, 180° C. or more. If the heat treatment temperature in step S5 is too high, there is a concern that the surface of the pad PD is contaminated due to the gas generated from the bonding material BD. Therefore, the heat treatment temperature in step S5 is particularly preferably 180 to 250° C.

In addition, although the case where the heat treatment is performed as the reduction treatment in step S5 has been described here, as a modification, an ultraviolet irradiation treatment can be used as the reduction treatment in step S5. By irradiating the lead frame LF and the semiconductor chip CP with ultraviolet rays, the oxide film (silver carbonate film) formed on the surface of the plating layer PL is irradiated with ultraviolet rays, whereby the oxide film (silver carbonate film) can be reduced (reduced to silver). In the case where the ultraviolet irradiation treatment is performed as the reduction treatment in step S5, since the surface of the plating layer PL oxidized by the oxygen plasma processing OP is reduced by the ultraviolet irradiation treatment, at least the surface of the plating layer PL is irradiated with ultraviolet rays.

Figure 13:
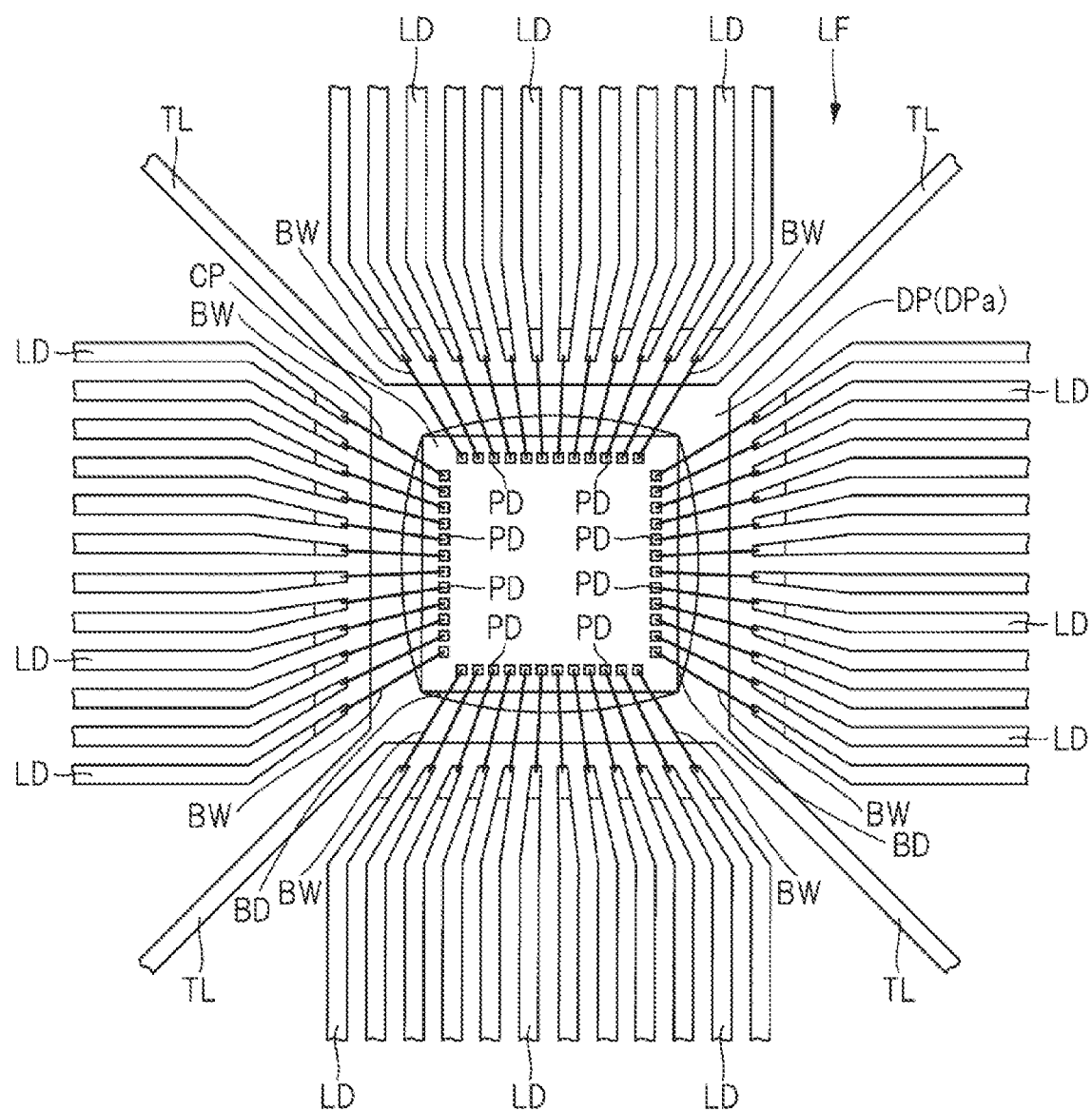
FIG. 13 is a plan view showing a wire bonding process.
Figure 14:
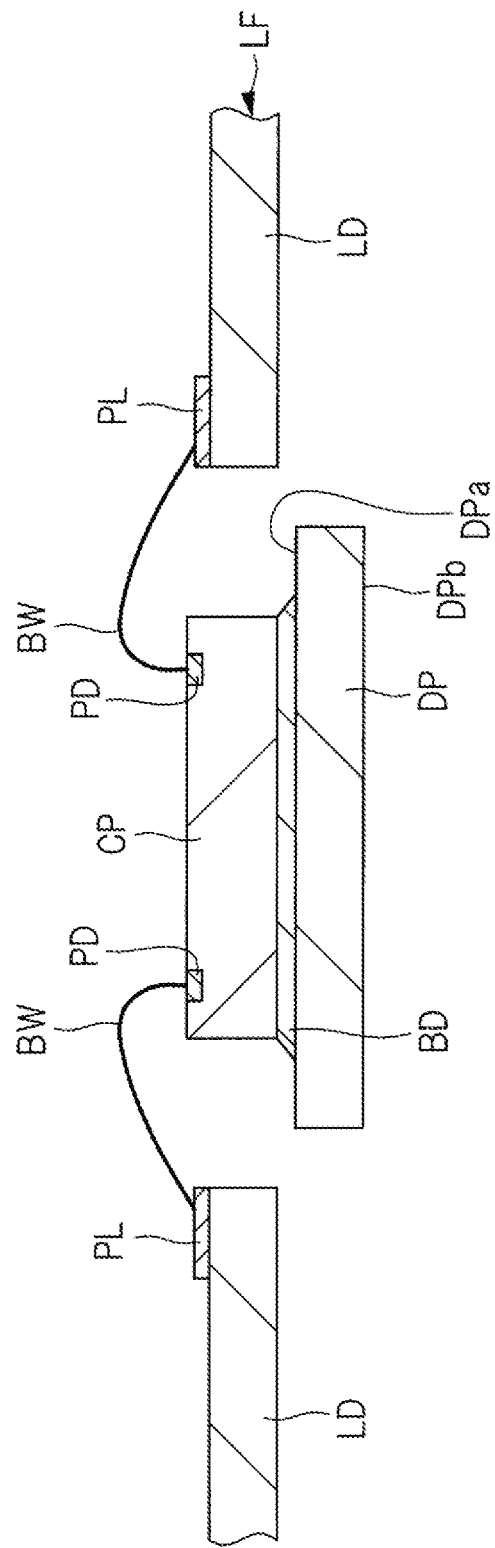
FIG. 14 is a cross-sectional view showing a wire bonding process.

Next, as shown in FIG. 13 and FIG. 14, a wire bonding process is performed in step S6 of FIG. 7.

In the wire bonding step of step S6, the plurality of pad electrodes PD of the semiconductor chip CP and the plurality of leads LD of the lead frame LF are electrically connected to each other via the plurality of wires BW. One end of each wire BW is connected (bonded) to each pad electrode PD of the semiconductor chip CP, and the other end is connected (bonded) to the plating layer PL on the upper surface of the inner lead portion of each lead LD. Therefore, one of both ends of the wire BW comes into contact with the plating layer PL. For example, one end of the wire BW may be connected (first bonded) to the pad electrode PD of the semiconductor chip CP, and then the other end of the wire BW may be connected (second bonded) to the plating layer PL of the inner lead portion of the lead LD. In addition, it is preferable to perform so-called ultrasonic bonding in which the wires BW are connected (bonded) while ultrasonic vibration is applied.

In the present embodiment, the oxygen plasma treatment OP of step S4 and the reduction treatment of step S5 are performed after step S3 (die bonding process) and before step S6 (wire bonding process), but the argon plasma treatment is not performed on the lead frame LF and the semiconductor chip CP after step S3 (die bonding process) and before step S6 (wire bonding process). More specifically, after step S3 (die bonding step), and before step S6 (wire bonding step), plasma treatment other than the oxygen plasma treatment OP of step S4 is not performed on the lead frame LF and the semiconductor chip CP. Also, during step S6, the lead frame LF and the semiconductor chip CP are not subjected to plasma treatment. That is, the argon plasma treatment is not performed on the lead frame LF and the semiconductor chip CP after step S3 (die bonding process) until step S6 (wire bonding process) is completed, and more specifically, the plasma process other than the oxygen plasma treatment OP of step S4 is not performed.

Figure 15:
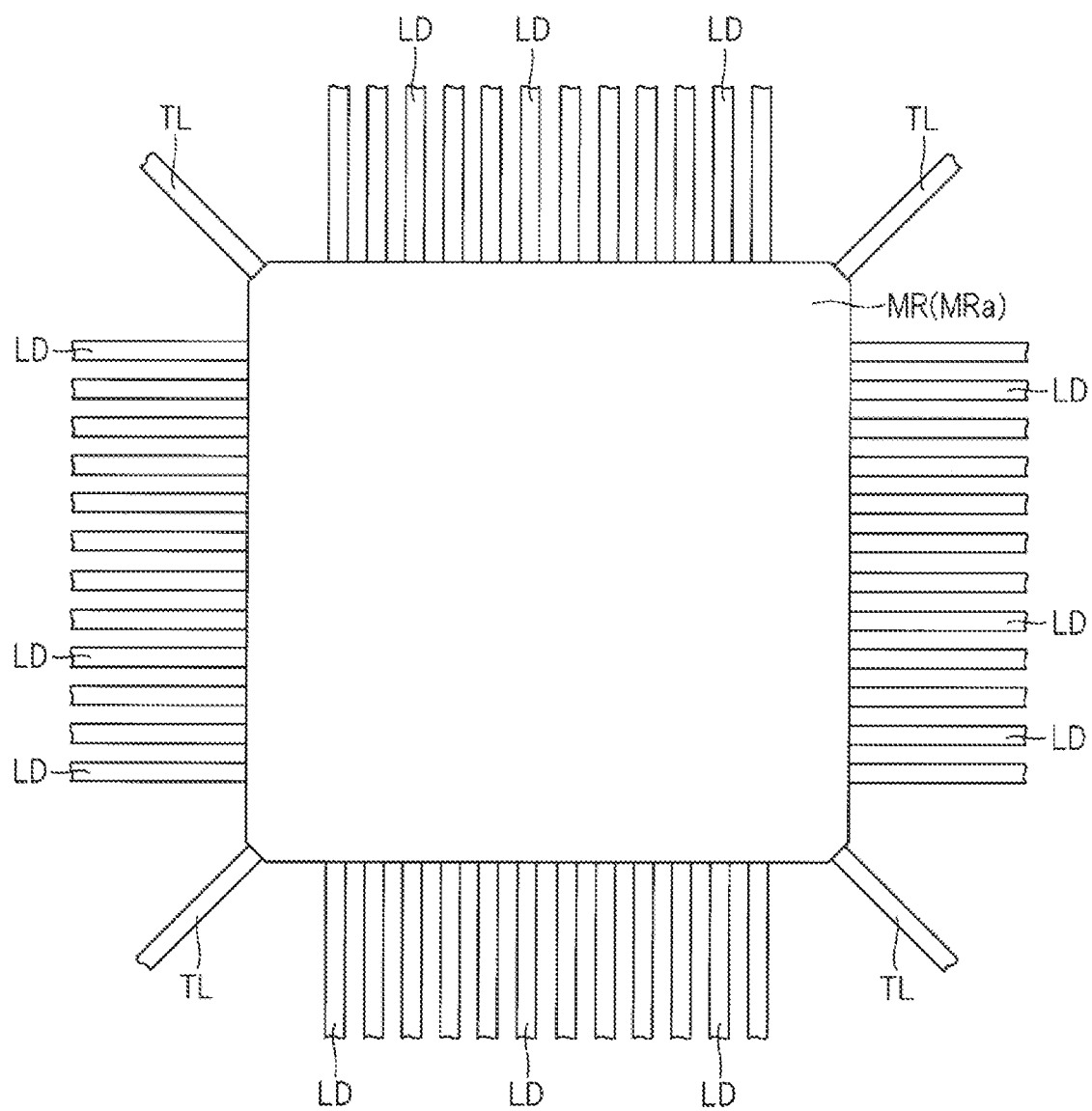
FIG. 15 is a plan view showing a molding process.
Figure 16:
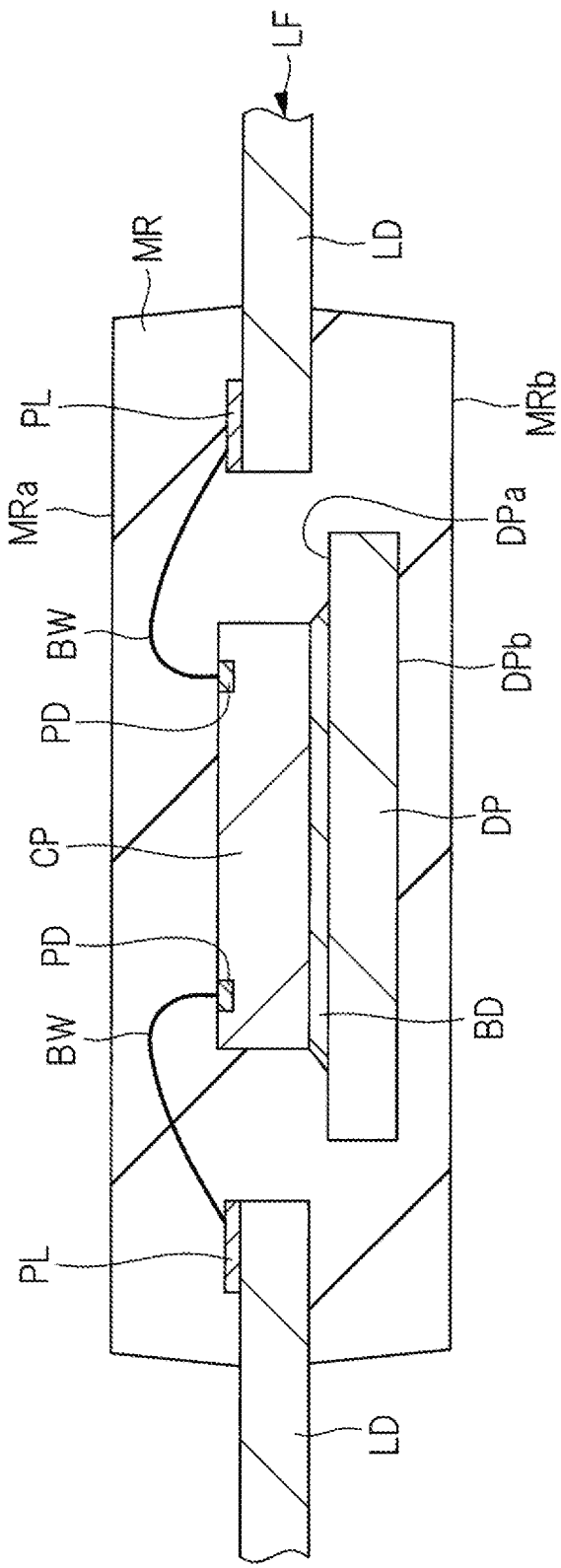
FIG. 16 is a cross-sectional view showing a molding process.

Next, resin sealing is performed by a molding process (resin molding process), and as shown in FIGS. 15 and 16, the semiconductor chip CP and the plurality of wires BW connected thereto are sealed by the sealing portion MR (step S7 in FIG. 7). By the molding process of step S7, a sealing portion MR for sealing the semiconductor chip CP, the die pad DP, the inner lead portion of the plurality of leads LD, the plurality of wires BW, and the suspension lead TL is formed. In the case of FIG. 16, the lower surface DPb of the die pad DP is not exposed from the sealing portion MR, and the lower surface DPb of the die pad DP is covered with the sealing portion MR. As another form, the lower surface DPb of the die pad DP may be exposed from the lower surface MRb of the sealing portion MR. Accordingly, in step S6 (molding process), a sealing portion MR (sealing body) for sealing the semiconductor chip CP, the plurality of wires BW, at least a portion of the die pad DP, and at least a portion (inner lead portion) of the plurality of leads LD is formed.

Next, a plating film (exterior plating film) is formed on the outer lead portion of the lead LD and the lower surface DPb of the die pad DP exposed from the sealing portion MR as necessary, and then the lead LD and the suspension lead TL are cut at predetermined positions outside the sealing portion MR and separated from the frame of the lead frame LF (step S8 in FIG. 7).

Figure 17:
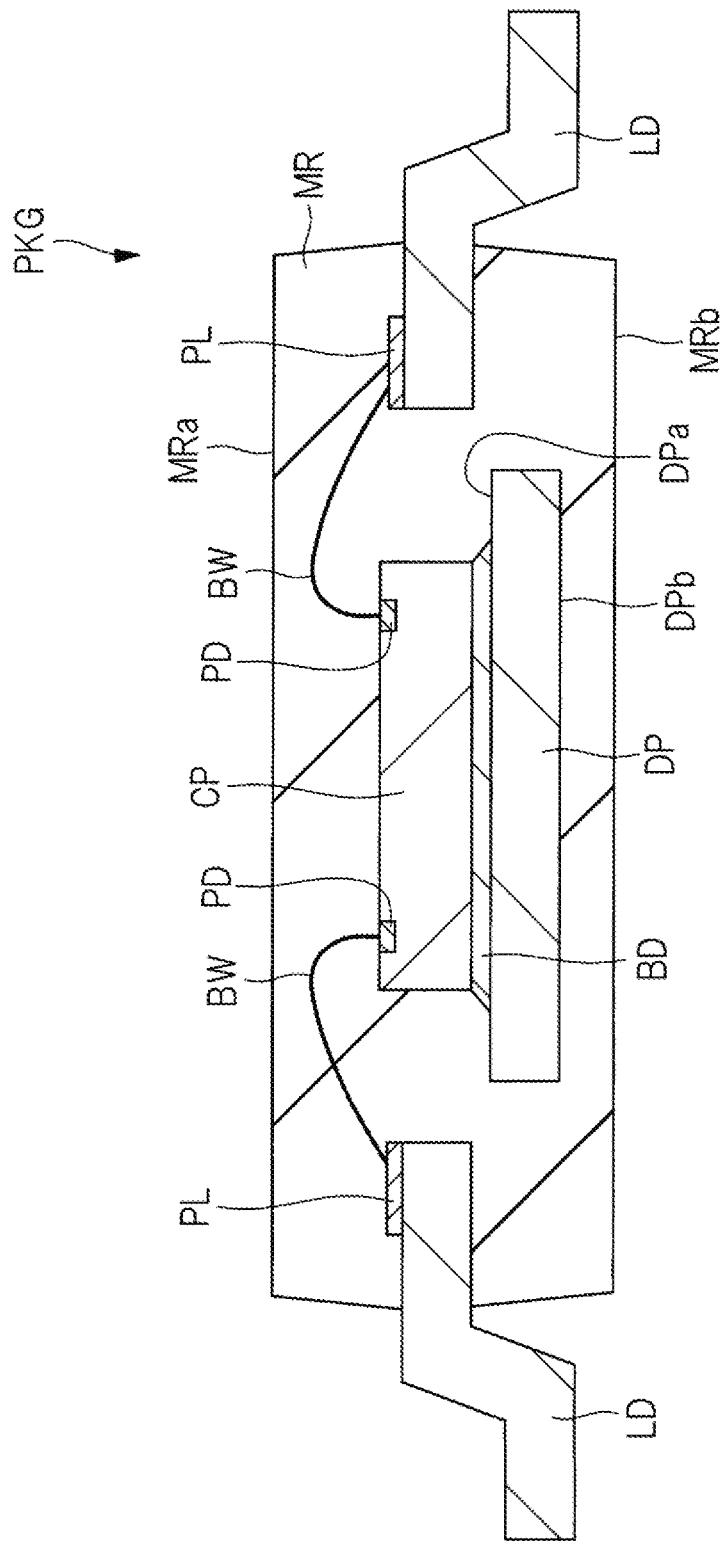
FIG. 17 is a cross-sectional view showing a lead forming process.

Next, as shown in FIG. 17, the outer lead portion of the lead LD protruding from the sealing portion MR is bent (lead forming, lead molding) (step S9 in FIG. 7). For example, the outer lead portion of the lead LD exposed from the sealing portion MR is molded to include a first portion extending in a direction away from the sealing portion MR, a second portion extending from the first portion toward the lower surface MRb side of the sealing portion MR, and a third portion connected to the second portion and extending in a direction away from the sealing portion MR. That is, the outer lead portion of the lead LD is molded into a gull wing shape. The first portion and the third portion are substantially parallel to the upper surface MRa or the lower surface MRb of the sealing portion MR.

In this manner, the semiconductor device PKG as shown in FIGS. 1 to 6 is manufactured.

Figure 18:
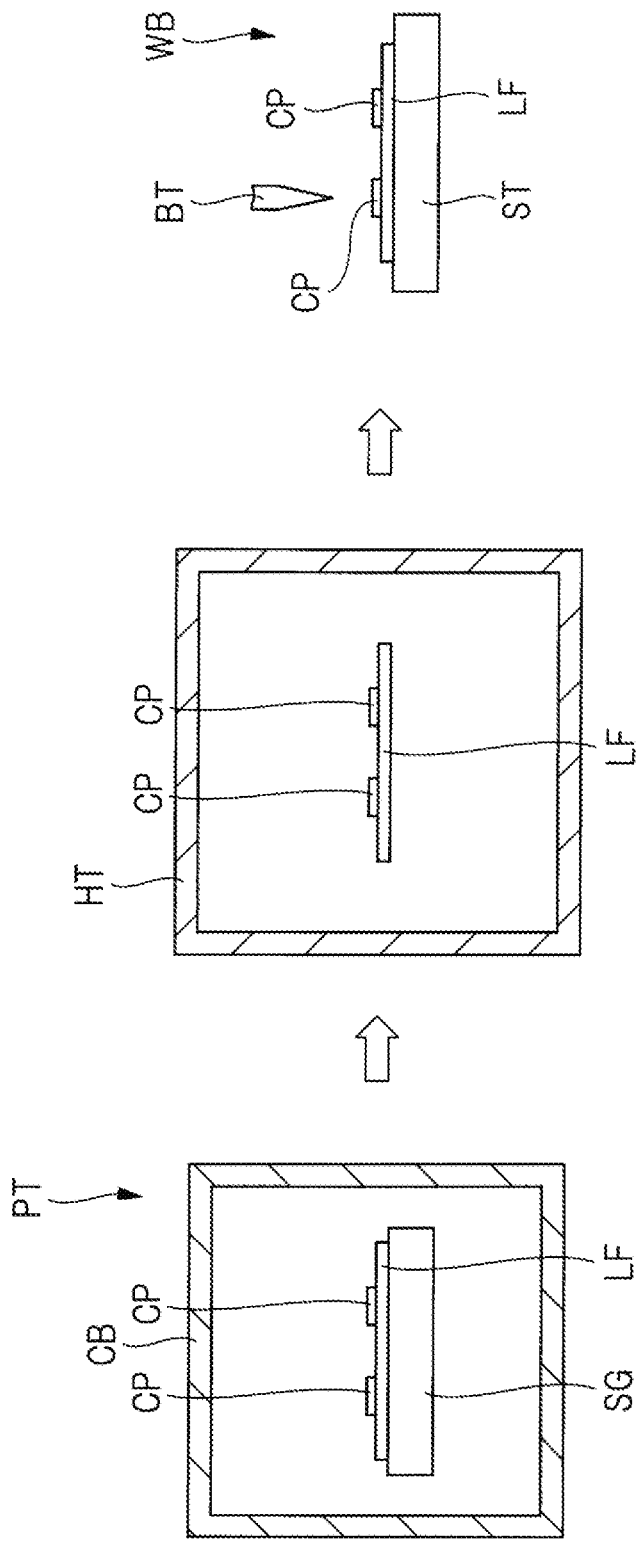
FIG. 18 is an explanatory view of an oxygen plasma treatment step, a reduction treatment step, and a wire bonding process.

Steps S4, S5, and S6 will be further described with reference to FIG. 18. FIG. 18 is an explanatory diagram of step S4 (oxygen plasma treatment step), step S5 (reduction treatment step), and step S6 (wire bonding step). In FIG. 18, arrows indicate the movement of the lead frame LF on which the semiconductor chip CP is mounted.

In order to perform step S4, first, as shown in FIG. 18, the lead frame LF on which the semiconductor chip CP is mounted is disposed in the chamber CB of a plasma treatment apparatus PT. The plasma treatment apparatus PT includes a chamber CB for plasma treatment and a stage SG for arranging the lead frame LF in the chamber CB, and the lead frame LF on which the semiconductor chip CP is mounted is arranged on the stage SG in the chamber CB. Then, an oxygen plasma treatment OP is performed on the lead frame LF and the semiconductor chip CP in the chamber CB. Thereafter, the lead frame LF on which the semiconductor chip CP is mounted is carried out from the chamber CB to the outside of the chamber CB. In this manner, step S4 can be performed.

The reduction treatment in step S5 is performed after the lead frame LF on which the semiconductor chip CP is mounted is carried out outside the chamber CB for plasma treatment. For example, the reduction treatment of step S5 can be performed by performing heat treatment on the lead frame LF on which the semiconductor chip CP is mounted using a heat treatment apparatus HT. When the ultraviolet irradiation treatment is performed as the reduction treatment in step S5, the ultraviolet irradiation treatment can be performed on the lead frame LF on which the semiconductor chip CP is mounted by using an ultraviolet treatment apparatus instead of the heat treatment apparatus HT.

In order to perform step S6, first, the lead frame LF on which the semiconductor chip CP is mounted is disposed on a stage ST of a wire bonding apparatus WB. The wire bonding apparatus WB includes the stage ST for arranging the lead frame LF, and a bonding tool (capillary) BT for performing a wire bonding operation. Then, the plurality of pad electrodes PD of the semiconductor chip CP and the plurality of leads LD of the lead frame LF are electrically connected via the plurality of wires (copper wires) BW using the wire bonding apparatus WB, that is, using the bonding tool BT of the wire bonding apparatus WB. For example, one end of the wire BW is connected (first bonded) to the pad electrode PD of the semiconductor chip CP using the bonding tool BT, and then the other end of the wire BW is connected (second bonded) to the plating layer PL of the inner lead portion of the lead LD. In this manner, step S6 can be performed. Thereafter, the lead frame LF on which the semiconductor chip CP is mounted is moved from above the stage ST of the wire bonding apparatus WB, and conveyed to the next step, i.e., the molding step of step S7.

The reduction treatment in step S5 is performed before the lead frame LF on which the semiconductor chip CP is mounted is disposed on the stage ST of the wire bonding apparatus WB. That is, after step S4, the lead frame LF subjected to the reduction treatment of step S5 is disposed on the stage ST of the wire bonding apparatus WB in step S6.

<Background of Examination>

The inventors of the present application have studied the use of copper wires for wire bonding.

Figure 19:
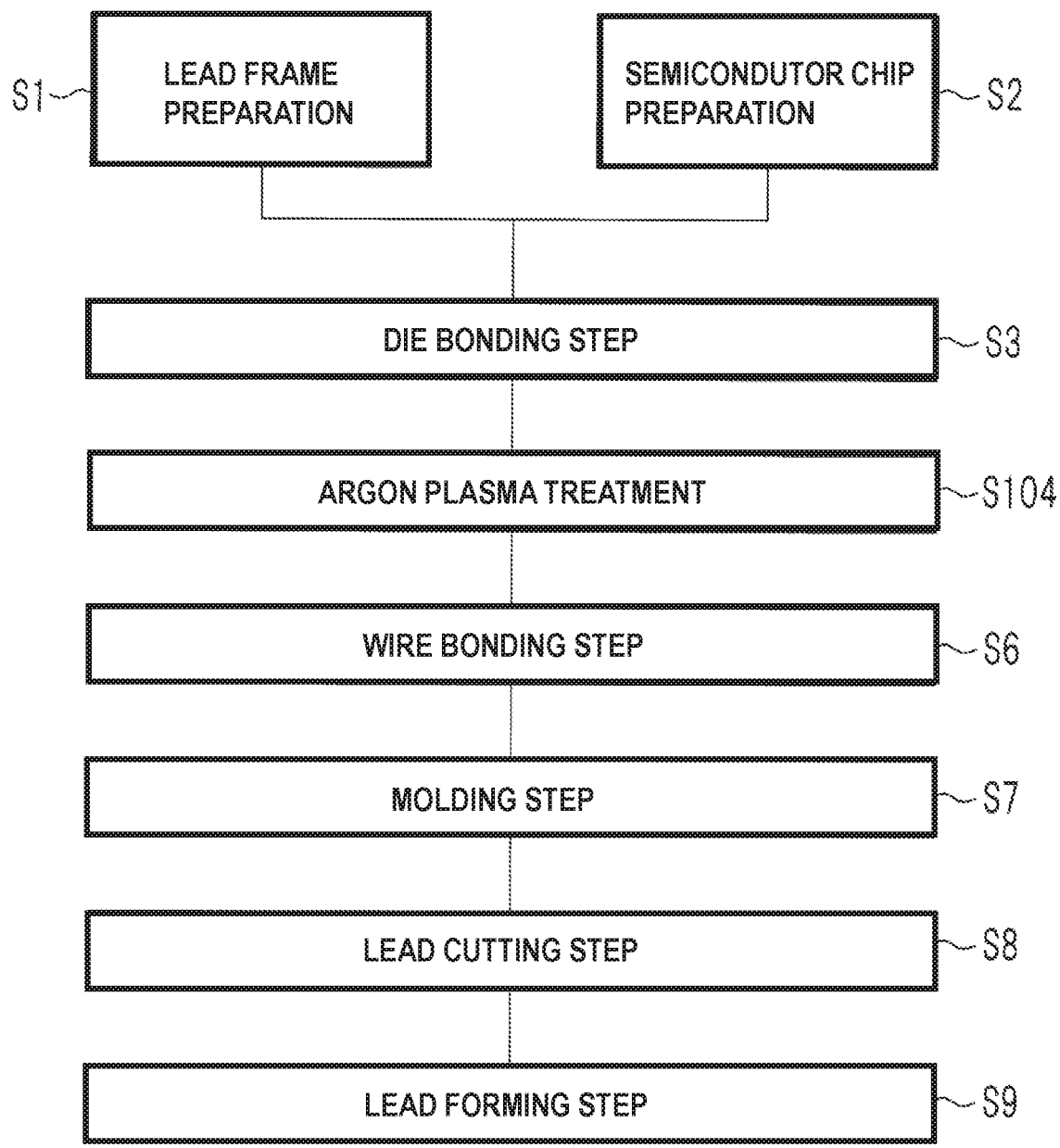
FIG. 19 is a process flow diagram showing a manufacturing process of the semiconductor device of the first study example.
Figure 20:
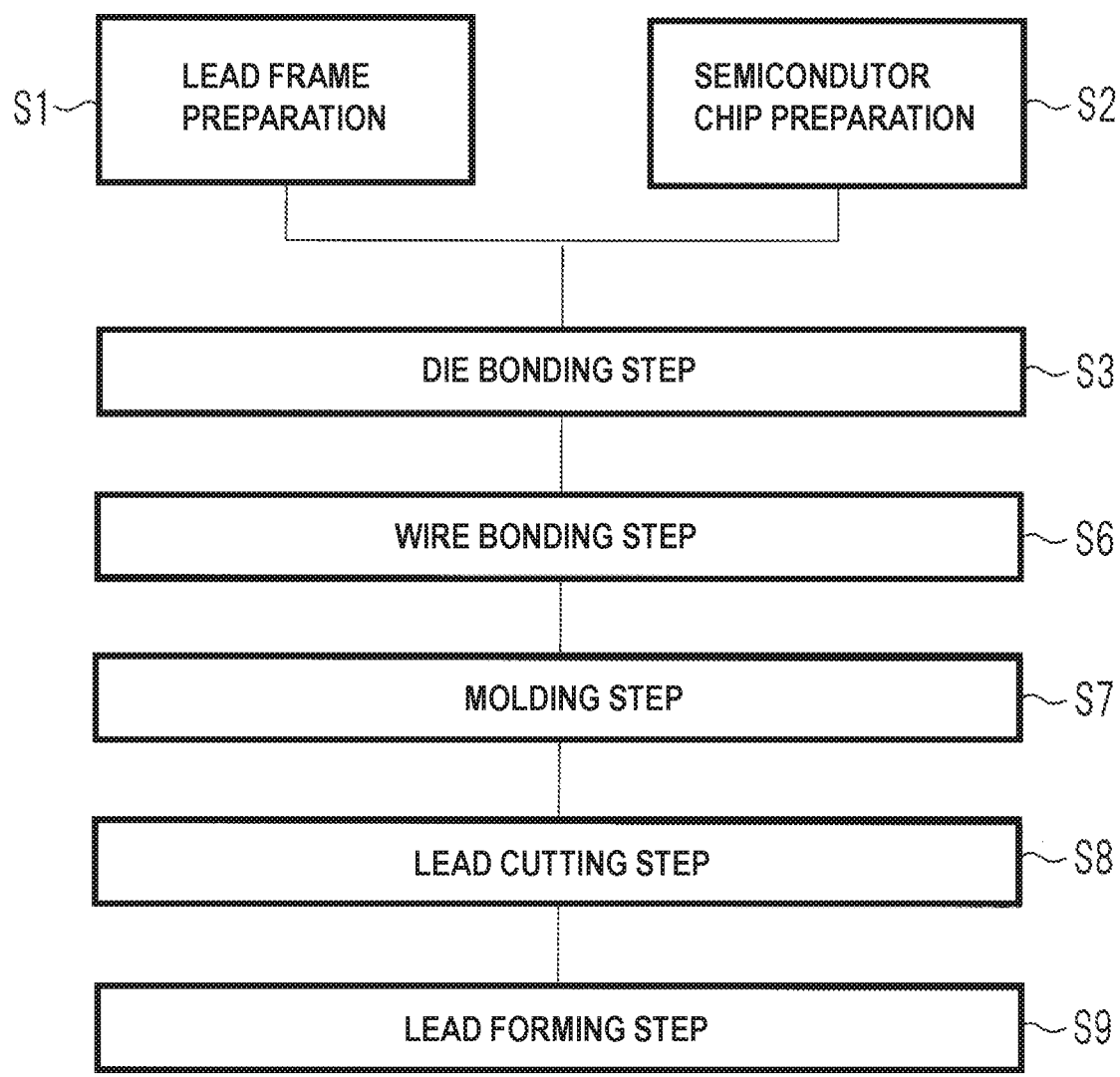
FIG. 20 is a process flow diagram showing a manufacturing process of the semiconductor device of the second study example.

FIG. 19 is a process flow diagram showing the manufacturing process of the semiconductor device of the first study example studied by the present inventor, and FIG. 20 is a process flow diagram showing the manufacturing process of the semiconductor device of the second study example studied by the present inventor, each of which corresponds to FIG. 7.

In the first study of FIG. 19, after the lead frame LF and the semiconductor chip CP are prepared in steps S1 and S2, and the die bonding process is performed in step S3, an argon plasma treatment (argon plasma cleaning) of step S104 is performed before the wire bonding process in step S6 is performed. In the first study of FIG. 19, after the argon plasma treatment of step S104, the wire bonding process of step S6, the molding process of step S7, the lead cutting process of step S8, and the lead forming process of step S9 are sequentially performed. In the first study example of FIG. 19, the oxygen plasma process of step S4 and the reduction treatment of step S5 are not performed. The second examination example of FIG. 20 is the same as the first examination example of FIG. 19 except that the argon plasma process S104 steps is not performed.

In the first study of FIG. 19, the argon plasma treatment of the step S104 is performed to remove contaminants from the surface of the plating layer PL of the lead frame LF and to clean the surface of the plating layer PL.

That is, in the argon plasma treatment, contaminants can be removed by the sputtering effect of argon ions. Therefore, in the argon plasma treatment, whether the contaminant is an organic substance or an inorganic substance, the contaminant can be removed by a physical action. Therefore, the contaminants adhering to the surface of the plating layer PL in the stage immediately before the step S104 can be removed by the argon plasma treatment S104 the step, and the surface of the plating layer PL can be cleaned. As a result, the wire BW can be connected to the surface of the cleaned plating layer PL in the wire bonding step of step S6, so that the wire BW can be easily connected to the plating layer PL.

However, the inventor's investigation revealed that the following problems occur in the case of the first investigation example of FIG. 19. The problem of the first examination example of FIG. 19 will be described below.

The present inventors have studied the use of copper wires for wire bonding. Since the copper wire is hard, in the wire bonding process using the copper wire, the copper wire is connected to the pad electrode PD with a relatively strong force.

At the interface between the copper wire and the pad electrode PD, an alloy layer is formed by the reaction between the copper wire and the pad electrode PD. By forming the alloy layer, the connection strength between the copper wire and the pad electrode PD is increased, and the reliability of the connection between the copper wire and the pad electrode PD can be increased.

Incidentally, after the pad electrode PD is formed in the semiconductor chip manufacturing process, the surface of the pad electrode PD is oxidized to some extent before the wire bonding process is performed in the semiconductor package assembling process. Therefore, a thin oxide layer (in the case of an aluminum pad electrode, a thin aluminum oxide layer) is formed on the surface of the pad electrode PD as a natural oxide film, and in the wire bonding step, a copper wire is connected to the pad electrode PD in a state in which a thin oxide layer is formed on the surface. Therefore, in the wire bonding step, the copper wire (specifically, the ball portion at the tip of the copper wire) is pressed against the oxide layer on the surface of the pad electrode PD (preferably, ultrasonic vibration is applied while pressing), whereby the oxide layer on the surface of the pad electrode PD is broken to expose the clean metal surface (the surface of the aluminum layer) of the pad electrode PD, and the copper wire (ball portion) and the clean metal surface of the pad electrode PD are brought into contact with each other to react with each other. As a result, an alloy layer (specifically, an alloy layer of copper and aluminum) is formed at the interface between the copper wire (ball portion) and the pad electrode PD, and the copper wire and the pad electrode PD are firmly bonded to each other.

However, it has been found that when the argon plasma treatment of step S104 is performed prior to the wire bonding process of step S6, the formation of the alloy layers at the interface between the copper wire and the pad electrode PD is inhibited in the wire bonding process of step S6, and the alloying rate at the interface between the copper wire and the pad electrode PD is lowered. This leads to a decrease in the connection strength between the copper wire and the pad electrode PD, which in turn leads to a decrease in the reliability of the connection between the copper wire and the pad electrode PD.

The alloying rate at the interface between the copper wire and the pad electrode PD corresponds to the ratio of the region of the area where the alloy layer (Cu—Al alloy layer) of the copper wire and the pad electrode PD is formed to the area of the interface between the copper wire and the pad electrode PD. For example, when the alloy layer (Cu—Al alloy layer) of the copper wire and the pad electrode PD is formed at the entire interface between the copper wire and the pad electrode PD, the alloying rate is 100%, and when the alloy layer (Cu—Al alloy layer) of the copper wire and the pad electrode PD is formed at about half of the interface between the copper wire and the pad electrode PD, the alloying rate is about 50%.

When the argon plasma treatment of step S104 is performed prior to the wire bonding process of step S6, the reason why the formation of the alloy layer at the interface between the copper wire and the pad electrode PD is inhibited in the wire bonding process of step S6 is that the OH group is bonded (adhered) to the oxide layer on the surface of the pad electrode PD during the argon plasma treatment of step S104. When the OH group is bonded to the oxide layer on the surface of the pad electrode PD, when the copper wire (ball portion) is pressed against the oxide layer on the surface of the pad electrode PD, the oxide layer on the surface of the pad electrode PD is bonded to the copper wire (ball portion), so that even if ultrasonic vibration is applied, the oxide layer on the surface of the pad electrode PD is hardly broken, and the clean metal surface (aluminum layer surface) of the pad electrode PD is hardly exposed. Therefore, the reaction between the copper wire (ball portion) and the metal layer (aluminum layer) constituting the pad electrode PD is inhibited by the oxide layer interposed therebetween. That is, formation of an alloy layer, specifically, an alloy layer of copper and aluminum, at the interface between the copper wire and the pad electrode PD is inhibited, resulting in a low alloying rate.

The reason why the OH group is bonded to the oxide layer on the surface of the pad electrode PD during the argon plasma treatment S104 the step is as follows. Since moisture or water vapor exists in the plasma treatment apparatus to some extent, when the argon plasma is performed, moisture or water vapor is also converted into plasma, and not only the argon plasma but also OH radicals (OH groups) are generated in the plasma, and the OH radicals are bonded to the oxide layer on the surface of the pad electrode PD. As a result, OH groups are bonded to the oxide layers on the surfaces of the pad electrodes PD at the time of the argon plasma treatment S104 the steps. In order to prevent this, it is only necessary to perform the argon plasma treatment S104 step after obtaining a state in which no moisture or water vapor exists in the plasma treatment apparatus, but it is difficult to obtain a state in which no moisture or water vapor exists in the plasma treatment apparatus in reality, and if the state is forcibly achieved, the costs and the manufacturing times are increased.

In other words, if the argon plasma treatment of the step S104 is omitted from the manufacturing process of the first study in FIG. 19 (which corresponds to the second study in FIG. 20), the copper wire is connected to the plating layer PL with contaminants attached to the surface of the plating layer PL of the lead frame LF. Therefore, in the case of the second examination example of FIG. 20, it is difficult to connect the copper wire to the plating layer PL of the inner lead portion of the lead LD, and there is a fear that the reliability of the connection between the plating layer PL of the inner lead portion of the lead LD and the copper wire may be lowered.

Therefore, when a copper wire is used, if the argon plasma treatment of the step S104 is performed as in the manufacturing process of the first study of FIG. 19, the reliability of the connections between the copper wire and the pad electrodes PD of the semiconductor chips CP may be lowered. In addition, if the argon plasma treatment S104 the steps is omitted as in the manufacturing process of the second study of FIG. 20, the reliability of the connections between the plating layers PL of the inner lead portions of the leads LDs and the copper wires may be lowered. Since these lead to deterioration of reliability of the semiconductor device, improvement thereof is desired.

<Key Features and Effects>

In the manufacturing process of the semiconductor device of the present embodiment, after the semiconductor chip CP is mounted on the die pad DP (chip mounting portion) of the lead frame LF via the bonding material BD (BD1) in step S3, the plurality of pad electrodes PD of the semiconductor chip CP and the plurality of leads LD are electrically connected via the plurality of wires BW in step S6. Thereafter, in step S7, a sealing portion MR for sealing at least a part of the semiconductor chip CP, the plurality of wires BW, the die pad DP, and at least a part of the plurality of leads LD is formed.

One of the main features of the present embodiment is to use a copper wire as the wire BW for electrically connecting the pad electrode PD and the lead LD of the semiconductor chip CP.

Another feature of the present embodiment is that in the lead frame LF prepared in step S1, a plating layer (silver plating layer) PL is formed on the surface of each of the plurality of leads LD. That is, each of the plurality of leads LD has a surface on which the plating layer PL is formed. In step S6, the wire BW is connected to the plating layer PL of the lead LD.

Yet another one of the main features of the present embodiment is to perform oxygen plasma treatment OP on the lead frame LF and the semiconductor chip CP in step S4 after step S3 (die bonding process) and before step S6 (wire bonding process).

Yet another one of the main features of the present embodiment is to perform the reduction treatment of step S5 (reduction treatment of the plating layer PL) after step S4 (oxygen plasma treatment OP) and before step S6 (wire bonding process).

In the present embodiment, the oxygen plasma treatment OP of step S4 is performed after step S3 (die bonding step) and before step S6 (wire bonding step). Therefore, the oxygen plasma treatment OP in step S4 can remove contaminants from the surface of the plating layer PL and clean the surface of the plating layer PL. In the present embodiment, after the oxygen plasma treatment OP in step S4, the reduction treatment of the plating layer PL is performed in step S5. Since the oxygen plasma treatment OP has a function of removing contaminants (contaminants consisting of organic matter) on the surface of the plating layer PL, but also has a function of oxidizing the surface of the plating layer PL, the contaminants on the surface of the plating layer PL can be removed by performing the oxygen plasma treatment OP of step S4, but the surface of the plating layer PL is oxidized. After the oxygen plasma treatment OP in step S4, the reduction treatment of the plating layer PL is performed in step S5, whereby the surface of the plating layer PL oxidized by the oxygen plasma treatment OP in step S4 can be reduced. Therefore, by performing the oxygen plasma treatment OP in step S4 and the reduction treatment of the plating layer PL in step S5 thereafter, a state in which contaminants are removed from the surface of the plating layer PL and the surface of the plating layer PL is not oxidized (a state in which the silver plating layer is exposed) can be obtained. Since the wire BW can be connected to the plating layer PL in this state in the wire bonding step of step S6, the wire BW can be easily connected to the plating layer PL, and the reliability of the connection between the plating layer PL of the inner lead portion of the lead LD and the wire BW can be improved.

Unlike the present embodiment, it is assumed that the wire bonding step of step S6 is performed without performing the reduction treatment of the plating layer PL of step S5 after the oxygen plasma treatment OP of step S4 is performed. In this case, since the wire BW is connected to the plating layer PL in a state where the surface of the plating layer PL is oxidized, it becomes difficult to connect the wire BW to the plating layer PL, the bonding strength between the plating layer PL and the wire BW is lowered, and the reliability of the connection between the plating layer PL of the inner lead portion of the lead LD and the wire BW is lowered.

In addition, unlike the present embodiment, it is assumed that the wire bonding step of step S6 is performed without performing both the oxygen plasma treatment OP of step S4 and the reduction treatment of step S5 thereafter, which corresponds to the second examination example of FIG. 20. In this case, since the copper wire is connected to the plating layer PL in a state where the contaminant adheres to the surface of the plating layer PL, it becomes difficult to connect the wire BW to the plating layer PL, the bonding strength between the plating layer PL and the wire BW is lowered, and the reliability of the connection between the plating layer PL of the inner lead portion of the lead LD and the wire BW is lowered.

In the present embodiment, since the wire bonding step of step S6 is performed after both the oxygen plasma treatment OP of step S4 and the reduction treatment of step S5 thereafter, the copper wire can be connected to the plating layer PL in a condition in which contaminants are removed from the surface of the plating layer PL and cleaned, and an oxide film (silver carbonate film) is not formed on the surface of the plating layer PL. This makes it easier to connect the wire BW to the plating layer PL, improves the bonding strength between the plating layer PL and the wire BW, and improves the reliability of the connection between the plating layer PL of the inner lead portion of the lead LD and the wire BW.

Further, as described above referring to the first study of FIG. 19, when the argon plasma treatment of step S104 is performed prior to the wire bonding step of step S6, the formation of the alloy layer at the interface between the copper wire and the pad electrode PD is inhibited in the wire bonding step of step S6, and the alloying rate at the interface between the copper wire and the pad electrode PD is lowered. This leads to a decrease in the connection strength between the copper wire and the pad electrode PD, which in turn leads to a decrease in the reliability of the connection between the copper wire and the pad electrode PD. It is considered that the reason why the formation of the alloy layer at the interface between the copper wire and the pad electrode PD is inhibited in the wire bonding step of step S6 is that the OH group is bonded (adhered) to the oxide layer on the surface of the pad electrode PD in the argon plasma treatment of step S104.

On the other hand, in the present embodiment, the plasma treatment performed after step S3 (die bonding step) and before step S6 (wire bonding step) is the oxygen plasma treatment OP of step S4. In oxygen plasma, OH radicals do not stably exist. This is because OH radicals tend to combine with oxygen radicals in the oxygen plasma. Therefore, even if moisture or water vapor exists somewhat in the plasma treatment apparatus, since moisture or water vapor is hardly converted into plasma when performing the oxygen plasma treatment OP, OH radicals are hardly generated, and even if OH radicals are generated, they are easily combined with oxygen radicals. Therefore, when the oxygen plasma treatment OP is performed, a phenomenon in which the OH group is bonded to the oxide layer on the surface of the pad electrode PD is unlikely to occur. That is, as in the first examination example of FIG. 19, when the argon plasma treatment of the step S104 is performed, a phenomenon that the OH group adheres (bonds) to the oxide layer on the surface of the pad electrode PD is apt to occur, but in contrast, in the case of the oxygen plasma treatment OP of the step S4, a phenomenon that the OH group binds to the oxide layer on the surface of the pad electrode PD is unlikely to occur. Therefore, in the present embodiment, in the oxygen plasma treatment OP in step S4, the amount (number) of OH groups bonded to the oxide layer on the surface of the pad electrode PD can be suppressed.

Therefore, in the present embodiment, in the wire bonding step, the copper wire (ball portion) is pressed against the oxide layer on the surface of the pad electrode PD (preferably, ultrasonic vibration is applied while pressing), whereby the oxide layer on the surface of the pad electrode PD is broken to expose the clean metal surface (aluminum layer surface) of the pad electrode PD, and the copper wire (ball portion) and the clean metal surface of the pad electrode PD can be contacted and reacted. As a result, an alloy layer (Cu—Al alloy layer) is formed at the interface between the copper wire (ball portion) and the pad electrode PD, and the copper wire and the pad electrode PD can be firmly bonded. In the present embodiment, since the oxygen plasma treatment OP is used as the plasma treatment performed in step S4, it is possible to suppress or prevent the OH group from being bonded to the oxide layer on the surface of the pad electrode PD, it is not necessary that the oxide layer on the surface of the pad electrode PD is hardly broken during the wire bonding as in the first study example, and the alloying rate at the interface between the copper wire and the pad electrode PD can be increased. Therefore, as compared with the first examination example of FIG. 19, the present embodiment can increase the alloying rate at the interface between the copper wire (wire BW) and the pad electrode PD, so that the connection strength between the copper wire (wire BW) and the pad electrode PD can be increased, and the reliability of the connection between the copper wire (wire BW) and the pad electrode PD can be improved. Therefore, the reliability of the semiconductor device can be improved.

Figure 21:
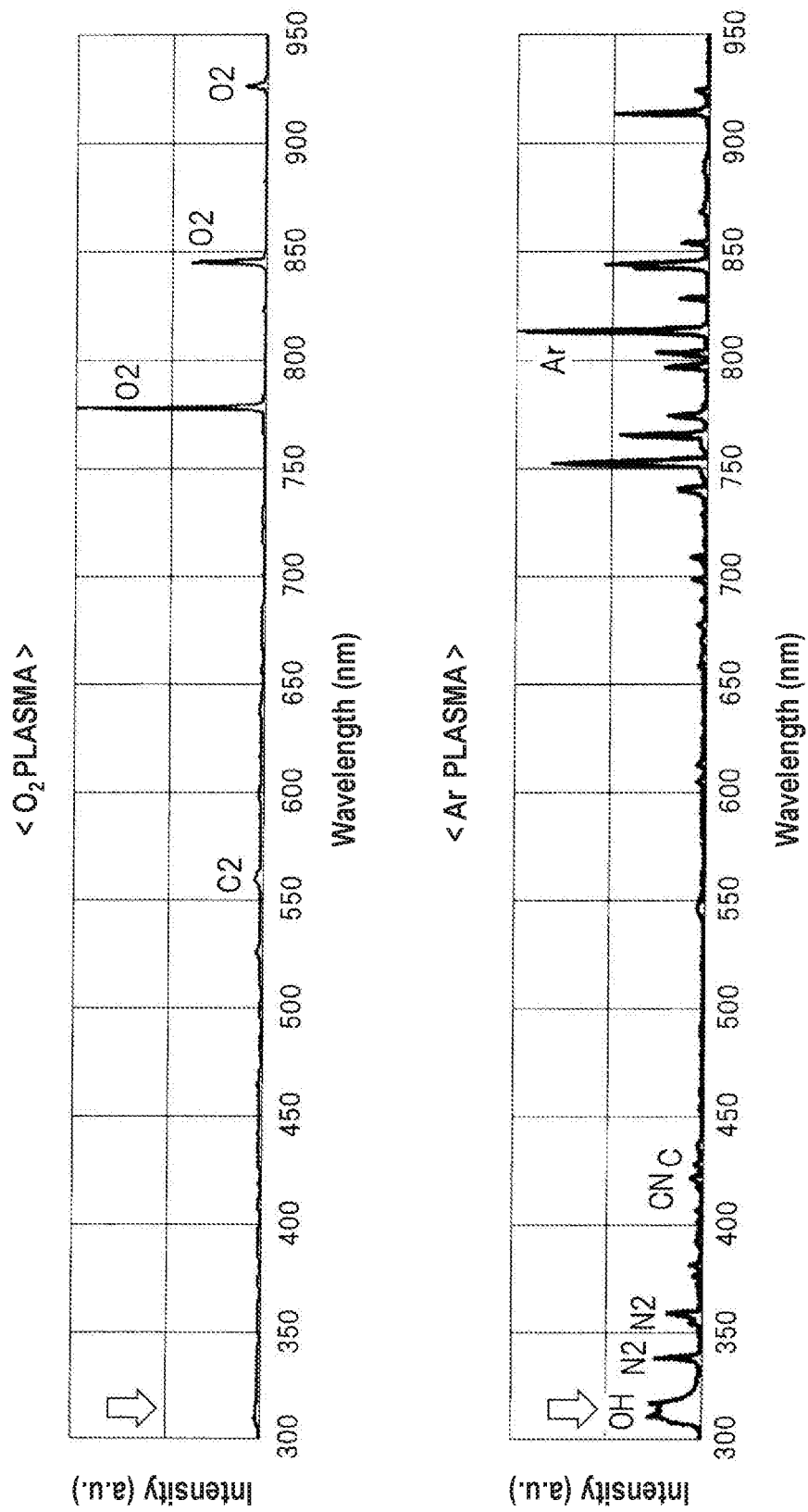
FIG. 21 is a graph showing the results of analyzing the emission spectrum of plasma.

FIG. 21 is a graph showing the results of analyzing the emission spectrum of plasma. FIG. 21 shows the results of examining the emission spectrum of the plasma and examining what kind of components exist in the plasma in the case where the O2 plasma (plasma of O2 gas) is generated and the case where the Ar plasma (plasma of Ar gas) is generated in the plasma treatment apparatus. The horizontal axis of the graph corresponds to the wavelength of light, the vertical axis of the graph corresponds to the intensity of light, and the position (wavelength) indicated by the arrow corresponds to the emission spectrum of the OH group (OH radical).

As can be seen from FIG. 21, when Ar plasma is generated in the film formation apparatus, an emission spectrum of an OH group is observed, and it is understood that OH groups (OH radicals) are present in the plasma in a certain amount. On the other hand, when O2 plasma is generated in the film forming apparatus, the emission spectrum of the OH group is hardly observed, and it is understood that the OH group (OH radical) hardly exists in the plasma. Therefore, as in the present embodiment, when the oxygen plasma treatment is performed in step S4, a phenomenon in which the OH group is bonded to the oxide layer on the surface of the pad electrode PD is unlikely to occur during the plasma treatment.

FIG. 22 is a table showing the results of examining the alloying ratio at the interface between the copper wire and the pad electrode and the tensile strength of the junction between the copper wire and the pad electrode of the semiconductor chip.

As can be seen from FIG. 22, when the argon plasma treatment (step S104) is performed before the wire bonding step (step S6) as in the first study example of FIG. 19, the alloying rate at the interface between the copper wire and the pad electrode is lowered as compared with the case where the plasma treatment is not performed before the wire bonding step as in the second study example of FIG. 20. This suggests that performing the argon plasma treatment prior to the wire bonding step as in the first study example of FIG. 19 may be a factor of inhibiting the formation of the alloy layer at the interface between the copper wire and the pad electrode in the wire bonding step. Reflecting this, when the argon plasma treatment is performed before the wire bonding step as in the first study example of FIG. 19, as can be seen from FIG. 22, the connection strength (tensile strength) between the copper wire and the pad electrode of the semiconductor chip is lowered.

On the other hand, in the case where the oxygen plasma treatment (step S4) is performed before the wire bonding step (step S6) as in the present embodiment, as can be seen from FIG. 22, the alloying rate (the alloying rate at the interface between the copper wire and the pad electrode) of the same degree as in the case where the plasma treatment is not performed before the wire bonding step as in the second study example of FIG. 20 can be obtained. This suggests that performing the oxygen plasma treatment before the wire bonding step as in the present embodiment does not hinder the formation of the alloy layer at the interface between the copper wire and the pad electrode PD in the wire bonding step. Reflecting this, when the oxygen plasma treatment (step S4) is performed before the wire bonding step (step S6) as in the present embodiment, the connection strength (tensile strength) between the copper wire and the pad electrode of the semiconductor chip can be increased as can be seen from FIG. 22.

Figure 24:
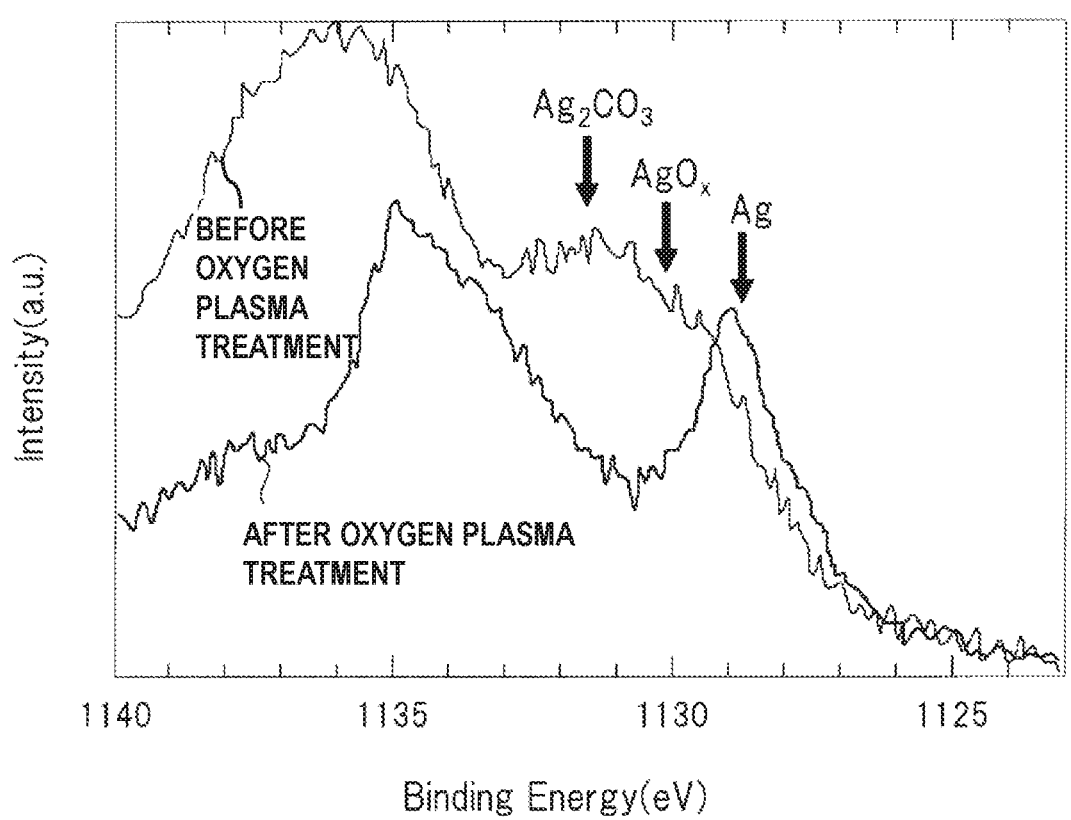
FIG. 24 is a graph showing an example of the results of XPS analysis on the surface of the plating layer.

FIG. 23 is a table showing the results of analyzing the composition of the surface of the plating layer PL. In FIG. 23, the composition analysis is performed by EDX (Energy dispersive X-ray spectrometry: energy-dispersive X-ray analysis). FIG. 24 is a graph showing an exemplary result of X-ray photoelectron spectroscopy (X-ray Photoelectron Spectroscopy) on the surfaces of the plating layers PLs. FIG. 25 is an explanatory view for explaining the reaction on the surface of the plating layer PL. FIG. 26 is an explanatory diagram for explaining the state of the surface of the plating layer PL.

The table of FIG. 23 shows the results of the composition analysis on the surface of the plating layer PL formed on the lead LD at each timing before the oxygen plasma treatment (corresponding before step S4 after step S3), before the reduction treatment (corresponding before step S5 after step S4), and after the reduction treatment (corresponding before step S6 after step S5) after the oxygen plasma treatment. At each timing, the number of samples analyzed is three.

From the table of FIG. 23, it is understood that, before the oxygen plasma treatment (corresponding to step S4 after step S3), oxygen (O) atoms are hardly detected from the surface of the plating layer PL, and silver oxide and silver carbonate are hardly formed on the surface of the plating layer PL.

Further, from the table of FIG. 23, it is suggested that, after the oxygen plasma treatment and before the reduction treatment (corresponding to the step S4 and before the step S5), oxygen (O) atoms and carbon (C) atoms are detected to some extent from the surface of the plating layer PL, and silver carbonate is formed on the surface of the plating layer PL.

In addition, from the table of FIG. 23, it can be seen that after the reduction treatment (corresponding to step S5 and before step S6), oxygen (O) atoms are hardly detected from the surface of the plating layer PL, the surface of the plating layer PL is reduced, and silver oxide and silver carbonate are hardly formed on the surface of the plating layer PL.

The graph of FIG. 24 shows the results of XPS analysis performed on the surface of the plating layer PL before the oxygen plasma treatment (corresponding to step S4 after step S3) and after the oxygen plasma treatment (corresponding to step S5 after step S4). In the graphs of FIG. 24, the binding energy position corresponding to $Ag_2CO_3$, the binding energy position corresponding to $AgO_x$, and the binding energy position corresponding to Ag are indicated by arrows, respectively.

In the graph of FIG. 24, before the oxygen-plasma treatment (corresponding to step S4 after step S3), intensities (values on the vertical axis of the graph of FIG. 24) at bond energy positions corresponding to $Ag_2CO_3$ and bond energy positions corresponding to $AgO_x$ are small, and peaks are shown at bond energy positions corresponding to Ag. On the other hand, in the graph of FIG. 24, after the oxygen-plasma treatment (corresponding to step S4 and before step S5), the strength (values on the vertical axis of the graph of FIG. 24) at the bond-energy position corresponding to the $Ag_2CO_3$ is considerably increased.

Therefore, it is understood from the graphs of FIG. 24 that $Ag_2CO_3$ (silver carbonate) and $AgO_x$ (silver oxide) are hardly formed on the surface of the plating layer PL before the oxygen plasma treatment (corresponding to step S4 after step S3), but $Ag_2CO_3$ (silver carbonate) is considerably formed on the surface of the plating layer PL after the oxygen plasma treatment (corresponding to step S5 after step S4).

FIG. 25 shows reaction formulae (Reaction Formula 1, Reaction Formula 2, and Reaction Formula 3) showing reactions occurring on the surface of the plating layer PL in the oxygen plasma treatment (corresponding to step S4) and the subsequent reduction treatment (corresponding to step S5).

Reaction Scheme 1 shown in FIG. 25 shows a reaction in which Ag (silver), C (carbon), and O2 (O) react to generate $Ag_2CO_3$ (silver carbonate). Reaction Scheme 2 shown in FIG. 25 shows a reaction in which $Ag_2CO_3$ (silver carbonate) is decomposed into $Ag_2O$ (silver oxide) and $CO_2$ (carbon dioxide). Reaction Scheme 3 shown in FIG. 25 shows a reaction in which $Ag_2O$ (silver oxide) is decomposed into Ag (silver) and $O_2$ (oxygen gas).

FIGS. 23 and 24 suggest that $Ag_2CO_3$ (silver carbonate) is generated on the surface of the plating layer PL when the oxygen plasma treatment (corresponding to step S4) is performed, which suggests that the reaction represented by the reaction equation 1 of FIG. 25 occurs on the surface of the plating layer PL in the oxygen plasma treatment of step S4. Further, FIGS. 23 and 24 suggest that the reduction treatment (corresponding to step S5) performed after the oxygen-plasma treatment (corresponding to step S4) reduces the $Ag_2CO_3$ (silver carbonate) formed on the surface of the plating layer PL, which suggests that the reaction represented by the reaction equation 2 of FIG. 25 and the reaction represented by the reaction equation 3 of FIG. 25 occur on the surface of the plating layer PL in the reduction treatment of step S4.

Of Ag (silver), C (carbon), and O (oxygen) for generating $Ag_2CO_3$ (silver carbonate) in Scheme 1, Ag (silver) is Ag (silver) constituting the plating layer PL, carbon (C) is C (carbon) contained in an organic substance (contaminant)

attached to the surface of the plating layer PL, and O (oxygen) is oxygen (oxygen radicals) contained in oxygen plasma.

FIG. 26 schematically shows the cross-sectional structure of the lead LD and the plating layer PL, but FIG. 26A corresponds to the cross-sectional structure in the stage immediately before the oxygen plasma treatment in step S4 (the stage after step S3 and before step S4). FIG. 26B corresponds to the cross-sectional structure in the stage after the oxygen plasma treatment in step S4 and before the reduction treatment in step S5, and FIG. 26C corresponds to the cross-sectional structure immediately after the reduction treatment in step S5 (after step S5 and before step S6).

Immediately before the oxygen plasma treatment in step S4, a contaminant OB containing an organic substance is attached to the surface of the plating layer PL (see FIG. 26A). When the oxygen plasma treatment in step S4 is performed, the contaminant OB adhering to the surface of the plating layer PL can be substantially removed, but C (carbon) contained in the contaminant OB, oxygen radicals in the oxygen plasma, and Ag (silver) constituting the plating layer PL react (i.e., a reaction of the reaction equation 1 in FIG. 25 occurs), and a thin $Ag_2CO_3$ (silver carbonate) layer PL1 is formed on the surface of the plating layer PL (see (b) in FIG. 26). By performing the reduction treatment in step S5 after the oxygen-plasma treatment in step S4, the thin $Ag_2CO_3$ layer PL1 on the surface of the plating layer PL is reduced (i.e., the reaction of Reaction Formula 2 and the reaction of Reaction Formula 3 in FIG. 25 occur) to become an Ag (silver) layer, and the surface of the plating layer (silver plating layer) PL has an exposed surface composed of Ag (silver) instead of a $Ag_2CO_3$ (silver carbonate) layer (see FIG. 26C). Therefore, in the wire bonding step of step S6, since the wire (copper wire) BW can be connected to the exposed surface of the plating layer (silver plating layer) PL made of Ag (silver), the connection strength between the plating layer PL and the wire BW can be secured, and therefore, the connection strength between the lead LD and the wire BW can be secured.

However, if the reduction treatment of step S5 is inadequate, the wire BW is connected to the plated layer PL while a thin silver carbonate ($Ag_2CO_3$) layer is formed on the surface of the plated layer PL in the wire bonding step of step S6. In this case, the silver carbonate layer formed on the surface of the plating layer PL may hinder the bonding between the wire BW and the plating layer PL, and the connection strength between the wire BW and the plating layer PL may be lowered. For this reason, the reduction treatment in step S5 needs to be performed so that the surface of the plating layer PL, more specifically, the silver carbonate layer on the surface of the plating layer PL, is sufficiently reduced.

Therefore, in the present embodiment, before the lead frame LF is disposed on the stage ST of the wire bonding apparatus WB for performing the wire bonding in step S6, the reduction treatment in step S5 is performed.

Unlike the present embodiment, it is also conceivable that the lead frame LF is heated to reduce the surface of the plating layer PL in a state in which the lead frame LF is disposed on the stage ST of the wire bonding apparatus WB. However, in this case, a considerable heating time (heat treatment time) is required in order to sufficiently reduce the surface of the plating layer PL, and the wire bonding operation cannot be performed until the heat treatment (heating treatment) is completed. Therefore, the time required after the lead frame LF is disposed on the stage ST of the wire bonding device WB until the wire bonding is completed and the lead frame LF is moved from the stage ST of the wire bonding apparatus WB becomes considerably long. This not only increases the manufacturing time of the semiconductor device, but also remarkably reduces the number of lead frames that can be processed per unit time by one wire bonding apparatus. In this case, it is necessary to accept a remarkable decrease in throughput or to increase the number of wire bonding device.

On the other hand, in the present embodiment, the reduction treatment of step S5 and the wire bonding step of step S6 are performed as separate step, and the reduction treatment of step S5 is performed on the lead frame LF before the lead frame LF is disposed on the stage ST of the wire bonding apparatus WB. That is, after the oxygen plasma treatment OP of step S4 is performed, the reduction treatment of step S5 is performed to reduce the surface of the plating layer PL formed on the lead LD of the lead frame LF, and thereafter, the lead frame LF is disposed on the stage ST of the wire bonding apparatus WB. That is, the lead frame LF is disposed on the stage ST of the wire bonding apparatus WB in a state where the surface of the plating layer PL of the lead frame LF is reduced by the reduction treatment in step S5. As a result, it is not necessary to perform the treatment of reducing the surface of the plating layer PL in a state in which the lead frame LF is disposed on the stage ST of the wire bonding device WB, so that the time required from disposing the lead frame LF on the stage ST of the wire bonding apparatus WB to starting the wire bonding operation by the bonding tool BT can be shortened. As a result, it is possible to shorten the time required from the placement of the lead frame LF on the stage ST of the wire bonding device WB to the completion of the wire bonding and the movement of the lead frame LF from the stage ST of the wire bonding apparatus WB. Therefore, the manufacturing time of the semiconductor device can be shortened, and the number of lead frames that can be processed per unit time by one wire bonding apparatus can be increased. Therefore, the throughput can be improved, and the number of wire bonding system can be suppressed.

In addition, in this embodiment, in step S6 (wire bonding step), there is a case where the wire bonding operation is performed while heating the lead frame LF (and the semiconductor chip CP) disposed on the stage ST of the wire bonding apparatus WB in order to facilitate bonding of the copper wire (wire BW) to the pad electrode PD and the plating layer PL, that is, to obtain better wire bonding. Since this heating is performed for facilitating wire bonding, and not for reducing the plating layer PL, the time required for heating can be shortened, and therefore, the time required from the placement of the lead frame LF on the stage ST of the wire bonding apparatus WB to the start of the wire bonding operation can be shortened. That is, when the lead frame LF disposed on the stage of the wire bonding apparatus reaches a predetermined wire bonding temperature, the wire bonding operation by the bonding tool BT can be quickly started.

On the other hand, unlike the present embodiment, when the lead frame LF is arranged on the stage ST of the wire bonding apparatus WB without performing step S5 and the lead frame LF arranged on the stage ST is heated to perform the reduction treatment of the plating layer PL, it is necessary to wait without starting the wire bonding operation even after the lead frame LF reaches a predetermined reduction treatment temperature while the reduction reaction is proceeding. After the reduction treatment of the plating layer PL is completed, the wire bonding operation is started. For this reason, the time required from the placement of the lead frame LF on the stage ST of the wire bonding apparatus WB to the start of the wire bonding operation by the bonding tool BT becomes long.

In the present embodiment, since the lead frame LF is arranged on the stage ST of the wire bonding apparatus WB after the reduction treatment in step S5 is performed, even when the wire bonding is performed while heating the lead frame LF arranged on the stage ST, the time required from the arrangement of the lead frame LF on the stage to the start of the wire bonding operation can be shortened. Therefore, the manufacturing time of the semiconductor device can be shortened, and the number of lead frames that can be processed per unit time by one wire bonding apparatus can be increased. Therefore, the throughput can be improved, and the number of wire bonding system can be suppressed.

In the present embodiment, since the reduction treatment of step S5 is performed on the lead frame LF before the lead frame LF is disposed on the stage ST of the wire bonding apparatus WB, the apparatus for performing the reduction treatment of step S5 is prepared separately from the apparatus for performing the wire bonding step of step S6 (wire bonding apparatus WB). As an apparatus for performing the reduction in step S5, for example, a lamp annealing apparatus of a lamp heating system, a heat treatment apparatus of a baking furnace type, a heat treatment apparatus of a hot plate type, or the like can be used. Then, after the lead frame LF on which the semiconductor chip CP is mounted is conveyed to the plasma treatment apparatus and subjected to the oxygen plasma treatment (step S4), the lead frame LF is conveyed to the heat treatment apparatus as described above and subjected to the heat treatment (step S5), and then the lead frame LF is conveyed to the wire bonding apparatus and subjected to the wire bonding (step S6).

In addition, an apparatus (heat treatment apparatus) for performing step S5 may be disposed in proximity to the wire bonding apparatus WB, and, for example, an apparatus (heat treatment apparatus) for performing step S5 may be disposed in a loader portion of the wire bonding apparatus WB.

In addition, a multi-chamber type apparatus (manufacturing apparatus) having a chamber for plasma treatment and a chamber for reduction treatment can be used to perform steps S4 and S5. In this case, the lead frame LF on which the semiconductor chip CP is mounted can be disposed in a chamber for plasma treatment and subjected to oxygen plasma treatment (step S4), and then the lead frame LF can be moved into a chamber for reduction treatment (step S5). Thereafter, the lead frame LF is moved to the wire bonding apparatus to perform wire bonding in step S6.

Even when the oxygen plasma treatment is performed while heating the lead frame LF in step S4, it is necessary to perform the reduction treatment in step S5 after performing the oxygen plasma treatment in step S4. This is because even when the oxygen plasma treatment is performed while heating the lead frame LF, the surface of the plating layer PL is oxidized at the stage when the oxygen plasma treatment is finished. That is, if the lead frame LF is subjected to the oxygen plasma treatment regardless of whether or not the lead frame LF is heated during the oxygen plasma treatment, the surface of the plating layer PL is oxidized. In the present embodiment, by performing the reduction treatment of step S5 after the oxygen plasma treatment of step S4, the surface of the plating layer PL oxidized by the oxygen plasma treatment of step S4 can be reduced by step S5 performed after step S4.

In addition, in the present embodiment, the case where the heat treatment is performed as the reduction treatment in step S5 has been described, but as a modification, the ultraviolet irradiation treatment may be performed as the reduction treatment in step S5. That is, after the oxygen plasma treatment in step S4, the surface of the plating layer PL can be reduced by irradiating the surface of the plating layer PL with ultraviolet rays as the reduction treatment in step S5. This is because the reactions of Reaction Formula 2 and Reaction Formula 3 in FIG. 25 can be caused by heat treatment, but can also be caused by ultraviolet irradiation treatment.

The ultraviolet irradiation treatment is a kind of light irradiation treatment. The light irradiation treatment is performed as the reduction treatment in step S5, and the light irradiated to the plating layer PL may be light of a wavelength capable of reducing the surface of the plating layer PL, and light of a wavelength other than ultraviolet can be used. However, from the viewpoint of making it possible to efficiently reduce the surface of the plating layer PL in a short time and making it easier to prepare an apparatus for performing the light irradiation treatment, it is preferable to use ultraviolet rays as the light to be irradiated to the plating layer PL. Therefore, the light irradiation treatment can be used as the reduction treatment in step S5, but it is preferable to use ultraviolet rays as the light to be irradiated to the plating layer PL, that is, to include ultraviolet rays as the light to be irradiated to the plating layer PL.

When the ultraviolet irradiation treatment (light irradiation treatment) is performed as the reduction treatment in step S5, the device (ultraviolet irradiation treatment apparatus, light irradiation treatment apparatus) for performing the ultraviolet irradiation treatment (light irradiation treatment) is prepared separately from the apparatus (wire bonding apparatus) for performing the wire bonding step in step S6. The ultraviolet irradiation treatment (light irradiation treatment) can be performed, for example, by lamp irradiation using an ultraviolet lamp.

In the case of performing heat treatment as the reduction treatment in step S5, there is a concern that a gas (outgas) is generated from the bonding material BD (die bonding material) by the heat treatment, but in the case of performing ultraviolet irradiation treatment (light irradiation treatment) as the reduction treatment in step S5, the bonding material BD does not need to be heated in step S5, so there is no concern that a gas is generated from the bonding material BD. Therefore, when the ultraviolet irradiation treatment (light irradiation treatment) is performed as the reduction treatment in step S5, it is possible to accurately prevent the occurrence of a problem caused by the gas (outgas) generated from the bonding material BD in step S5.

On the other hand, in the case of performing the heat treatment as the reduction treatment in step S5, the reaction of Reaction Formula 2 and Reaction Formula 3 in FIG. 25 is promoted more easily than in the case of performing the ultraviolet irradiation treatment (light irradiation treatment) as the reduction treatment in step S5, and therefore, the reduction treatment of the plating layer PL becomes easier to perform.

The invention made by the present inventor has been described above in detail based on the embodiment, but the present invention is not limited to the embodiment described above, and it is needless to say that various modifications can be made without departing from the gist thereof.

What is claimed is:

1. A method of manufacturing a semiconductor device, comprising the steps of:

(a) preparing a lead frame including a plurality of leads, and a chip mounting portion, each of the plurality of leads having a surface on which a silver plating layer is formed;
(b) mounting a semiconductor chip on the chip mounting portion of the lead frame via a bonding material;
(c) after the step (b), performing an oxygen plasma treatment on the lead frame and the semiconductor chip;
(d) after the step (c), reducing a surface of the silver plating layer; and
(e) after the step (d), electrically connecting a plurality of pad electrodes of the semiconductor chip and the plurality of leads via a plurality of copper wires,
wherein, in the step (e), the plurality of copper wires is connected to the plurality of leads, respectively, via the silver plating layer.

2. The method of manufacturing a semiconductor device according to claim 1, further comprising:
(f) after the step (e), forming a sealing body sealing the semiconductor chip, the plurality of copper wires, at least a portion of the chip mounting portion, and at least a portion of the plurality of leads.

3. The method of manufacturing a semiconductor device according to claim 1,
wherein, in the step (d), the surface of the silver plating layer is reduced by a heat treatment.

4. The method of manufacturing a semiconductor device according to claim 3,
wherein the heat treatment in the step (d) is performed at 180° C. or higher.

5. The method of manufacturing a semiconductor device according to claim 3,
wherein the heat treatment in the step (d) is performed at 180° C. or more and 250° C. or less.

6. The method of manufacturing a semiconductor device according to claim 1,
wherein in the step (d), the surface of the silver plating layer is reduced by light irradiation treatment.

7. The method of manufacturing a semiconductor device according to claim 1,
wherein in the step (d), the surface of the silver plating layer is reduced by ultraviolet irradiation treatment.

8. The method of manufacturing a semiconductor device according to claim 1,
wherein the surface of the silver plating layer is oxidized by the oxygen plasma treatment in the step (c), and the surface of the silver plating layer oxidized in the step (c) is reduced in the step (d).

9. The method of manufacturing a semiconductor device according to claim 8,
wherein the contaminant adhering to the surface of the silver plating layer is removed and the surface of the silver plating layer is oxidized by the oxygen plasma treatment in the step (c).

10. The method of manufacturing a semiconductor device according to claim 9,
wherein the contaminant contains an organic substance.

11. The method of manufacturing a semiconductor device according to claim 10,
wherein silver carbonate is formed on the surface of the silver plating layer by the oxygen plasma treatment in the step (c), and the silver carbonate is reduced in the step (d).

12. The method of manufacturing a semiconductor device according to claim 1,
wherein a plasma treatment other than the oxygen plasma treatment of the step (c) is not performed after the step (b) and before the step (e).

13. The method of manufacturing a semiconductor device according to claim 1,
wherein the step (e) includes:
(e1) arranging the lead frame on which the semiconductor chip is mounted on a stage of a wire bonding apparatus; and
(e2) after the step (e1), electrically connecting the plurality of pad electrodes of the semiconductor chip and the plurality of leads via the plurality of copper wires by the wire bonding apparatus,
wherein the step (d) is performed before the step (e1).

14. The method of manufacturing a semiconductor device according to claim 13,
wherein the step (c) comprises:
(c1) disposing the lead frame on which the semiconductor chip is mounted in a chamber for plasma treatment;
(c2) performing oxygen plasma treatment on the lead frame and the semiconductor chip in the chamber after the step (c1); and
(c3) carrying out the lead frame on which the semiconductor chip is mounted in the chamber after the step (c3),
wherein the step (d) is performed after the step (c3).

15. A method of manufacturing a semiconductor device, comprising the steps of:
(a) preparing a lead frame including a plurality of leads, and a chip mounting portion, each of the plurality of leads having a surface on which a silver plating layer is formed;
(b) mounting a semiconductor chip on the chip mounting portion of the lead frame via a bonding material;
(c) after the step (b) performing oxygen plasma treatment on the lead frame and the semiconductor chip;
(d) after the step (c) performing heat treatment on the lead frame and the semiconductor chip;
(e) after the step (d) disposing the lead frame on which the semiconductor chip is mounted on a stage of a wire bonding apparatus; and
(f) after the step (e) electrically connecting a plurality of pad electrodes of the semiconductor chip and the plurality of leads via a plurality of copper wires by the wire bonding apparatus,
wherein, in the step (f), the plurality of copper wires is connected to the plurality of leads, respectively, via the silver plating layer.

16. The method of manufacturing a semiconductor device according to claim 15,
wherein the surface of the silver plating layer is oxidized by the oxygen plasma treatment in the step (c), and
wherein the surface of the silver plating layer oxidized in the step (c) is reduced by the heat treatment in the step (d).

17. The method of manufacturing a semiconductor device according to claim 15,
wherein silver carbonate is formed on the surface of the silver plating layer by the oxygen plasma treatment in the step (c), and
wherein the silver carbonate is reduced by the heat treatment in the step (d).

18. A method of manufacturing a semiconductor device, comprising the steps of:

(a) preparing a lead frame including a plurality of leads, and a chip mounting portion, each of the plurality of leads having a surface on which a silver plating layer is formed;
(b) mounting a semiconductor chip on the chip mounting portion of the lead frame via a bonding material;
(c) after the step (b) performing oxygen plasma treatment on the lead frame and the semiconductor chip;
(d) after the step (c) performing an ultraviolet irradiation treatment on the lead frame and the semiconductor chip;
(e) after the step (e) disposing the lead frame on which the semiconductor chip is mounted on a stage of a wire bonding apparatus; and
(f) after the step (e) electrically connecting a plurality of pad electrodes of the semiconductor chip and the plurality of leads via a plurality of copper wires by the wire bonding apparatus,
wherein, in the step (f), the plurality of copper wires is connected to the plurality of leads, respectively, via the silver plating layer.

19. The method of manufacturing a semiconductor device according to claim 18,
wherein the surface of the silver plating layer is oxidized by the oxygen plasma treatment in the step (c), and
wherein the surface of the silver plating layer oxidized in the step (c) is reduced by the ultraviolet irradiation treatment in the step (d).

20. The method of manufacturing a semiconductor device according to claim 18,
wherein silver carbonate is formed on the surface of the silver plating layer by the oxygen plasma treatment in the step (c), and
wherein the silver carbonate is reduced by the ultraviolet irradiation treatment in the step (d).

* * * * *